United States Patent
Mashino

(10) Patent No.: US 6,661,077 B2
(45) Date of Patent: Dec. 9, 2003

(54) SEMICONDUCTOR DEVICE INCLUDING PRIMARY CONNECTING PLUG AND AN AUXILIARY CONNECTING PLUG

(75) Inventor: Naohiro Mashino, Nagano (JP)

(73) Assignee: Shinko Electric Industries Co., Ltd, Nagano (JP)

(*) Notice: Subject to any disclaimer, the term of this patent is extended or adjusted under 35 U.S.C. 154(b) by 0 days.

(21) Appl. No.: 10/040,658

(22) Filed: Jan. 7, 2002

(65) Prior Publication Data

US 2003/0092256 A1 May 15, 2003

(30) Foreign Application Priority Data

Jan. 10, 2001 (JP) .......................... 2001-002152

(51) Int. Cl.[7] .......................... H01L 29/00; H01L 29/06
(52) U.S. Cl. .................. 257/513; 257/514; 257/515; 257/516; 257/520; 257/622
(58) Field of Search .................. 257/301, 302, 257/303, 304, 305, 510, 513, 514, 515, 516, 520, 622, 758

(56) References Cited

U.S. PATENT DOCUMENTS

| | | | |
|---|---|---|---|
| 6,417,535 B1 | * | 7/2002 | Johnson et al. ............. 257/306 |
| 6,548,338 B2 | * | 4/2003 | Bernstein et al. ........... 438/210 |
| 6,597,026 B2 | * | 7/2003 | Ogura .......................... 257/287 |
| 2002/0066916 A1 | * | 6/2002 | Hsu et al. ..................... 257/301 |
| 2003/0063486 A1 | * | 4/2003 | Noble .......................... 365/102 |

FOREIGN PATENT DOCUMENTS

| | | |
|---|---|---|
| JP | A 10-223833 | 8/1998 |
| JP | A 10-303364 | 11/1998 |

* cited by examiner

*Primary Examiner*—Ngân V. Ngô
(74) *Attorney, Agent, or Firm*—Paul & Paul

(57) ABSTRACT

In order that the yield can be enhanced, the method of manufacturing a semiconductor device comprises the steps of: forming first holes 101a not penetrating a support side silicon wafer 101; forming a ground insulating film 102; forming primary connection plugs 105a by charging copper into the first holes 101a; forming a semiconductor film 108 on one face side of the support side silicon wafer 101 through an intermediate insulating film 109; forming elements on the semiconductor film 108; exposing bottom faces of the primary connection plugs 105a by polishing the other face of the support side silicon wafer 101; forming second holes 111 extending from an element forming face of the semiconductor film 108 to the primary connection plugs 105; and forming auxiliary connection plugs 112a for electrically connecting the elements with the primary connection plugs 105a by charging copper into the second holes 111.

2 Claims, 20 Drawing Sheets

↑ SEPARATION

116

108

101

SEMICONDUCTOR DEVICE INCLUDING PRIMARY CONNECTING PLUG AND AN AUXILIARY CONNECTING PLUG

BACKGROUND OF THE INVENTION

1. Technical Field of the Invention

The present invention relates to a semiconductor device and to a method of manufacturing a semiconductor device. More particularly, the present invention relates to a technique effectively used for reducing damage, to elements which are provided in a semiconductor device, in the process of manufacturing the semiconductor device.

2. Description of the Related Art

Various semiconductor devices are mounted on electronic equipment. Recently, electronic equipment has been downsized. In accordance with downsizing of electronic equipment, a semiconductor device having a three-dimensional mounting structure has been proposed. Examples of the three-dimensional mounting structure of the prior art are disclosed in Japanese Unexamined Patent Publication Nos. 10-223833 and 10-303364.

According to the above patent publications, there has been proposed a three-dimensional mounting structure in which a plurality of semiconductor elements are laminated in the vertical direction. Each semiconductor element composing this three-dimensional mounting structure mainly includes a silicon substrate, on the surface of which elements such as transistors are formed. In this silicon substrate, metallic plugs electrically connected with the above elements are embedded in the thickness direction of the silicon substrate. Electric power is supplied and signals are inputted into the elements through these metallic plugs.

In this connection, according to the above patent publications, the metallic plugs in the silicon substrate are formed as follows. After elements have been formed on one of the faces of the silicon substrate, holes not penetrating the silicon substrate are formed on this face, that is, holes not penetrating the silicon substrate are formed on the face of the silicon substrate on which the elements have already been formed, and then these holes are charged with metal.

However, the above method, in which the holes are formed in the substrate after the elements have already been formed on it, is disadvantageous in that the elements formed in the periphery of the holes are damaged when the holes are formed. Therefore, the yield of manufacturing a semiconductor device is deteriorated.

SUMMARY OF THE INVENTION

The present invention has been devised in order to solve the problems caused in the prior art.

Accordingly an object of the present invention is to provide a method of manufacturing a semiconductor device by which the yield of manufacturing a semiconductor device can be enhanced.

According to the present invention, there is provided a method of manufacturing a semiconductor device, said method comprising the following steps of: forming first holes not penetrating a support side semiconductor substrate on one of faces of the support side semiconductor substrate; forming a ground insulating film on one of the faces of the support side semiconductor substrate and also on side walls and bottom sections of the first holes; forming primary connection plugs by charging a first metal into the first holes; forming a semiconductor film on one face side of the support side semiconductor substrate via an intermediate insulating film; forming elements on the semiconductor film; exposing bottom faces of the primary connection plugs by polishing the other face of the support side semiconductor substrate; forming second holes extending from the element forming face of the semiconductor film to the primary connection plugs; and forming auxiliary connection plugs for electrically connecting the elements with the primary connection plugs by charging a second metal into the second holes.

According to another aspect of the present invention, there is provided a method of manufacturing a semiconductor device, said method comprising the following steps of: forming first holes not penetrating a support side insulating substrate on one face of the support side insulating substrate; forming primary connection plugs by charging a first metal into the first holes; forming a semiconductor film on one face side of the support side insulating substrate via an intermediate insulating film; forming elements on the semiconductor film; exposing bottom faces of the primary connection plugs by polishing the other face of the support side insulating substrate; forming second holes extending from an element forming face of a semiconductor film to the primary connection plugs; and forming auxiliary connection plugs for electrically connecting the elements with the primary connection plugs by charging the second metal into the second holes.

Next, the operation of the present invention will be explained below.

The method of manufacturing a semiconductor device of the present invention includes the following steps (a) to (h).

(a) Step of forming the first holes, which do not penetrate the support side semiconductor substrate, on one of the faces of the support side semiconductor substrate.

(b) Step of forming a ground insulating film on one of the faces of the support side semiconductor substrate and also on the side walls and the bottom sections of the first holes.

(c) Step of forming primary connection plugs by charging the first metal into the first holes after the ground insulating film has been formed.

(d) Step of forming a semiconductor film on one face side of the support side semiconductor substrate via an intermediate insulating film after the primary connection plugs have been formed.

(e) Step of forming elements on the semiconductor film after the semiconductor film has been formed.

(f) Step of exposing bottom faces of the primary connection plugs by polishing the other face of the support side semiconductor substrate after the elements have been formed.

(g) Step of forming the second holes extending from the element forming face of the semiconductor film to the primary connection plugs.

(h) Step of forming auxiliary connection plugs for electrically connecting the elements with the primary connection plugs by charging the second metal into the second holes.

According to the above manufacturing method, after the step of forming the first holes (step (a) described above), the step of forming the elements (step (e) described above) is executed. Therefore, when the first holes are formed, no elements are damaged. Accordingly, the yield of manufacturing the semiconductor device can be enhanced.

In step (a) described above, wiring grooves may be formed on one of the faces of the support side semiconductor substrate. In the step of forming the primary connection plugs (step (c) described above), these wiring channels are charged with the first metal and become the primary wiring. However, this primary wiring is embedded in the support side semiconductor substrate. Therefore, irregularities on the support side semiconductor substrate are small compared with a case in which wiring is provided on the support side semiconductor substrate.

Further, in step (b) described above, a wiring embedding insulating film having opening sections for minute wiring may be formed on a ground insulating film after the ground insulating film has been formed. Into these opening sections for minute wiring, the first metal is charged in the step of forming the primary connection plugs (step (c) described above), so that these opening sections for minute wiring become minute wiring. These opening sections for minute wiring are formed on the wiring embedding insulating film, the thickness of which is smaller than that of the support side semiconductor substrate. Therefore, these opening sections for minute wiring are remarkably minute compared with the wiring grooves formed on the support side semiconductor substrate. For the above reasons, the minute wiring is very minute compared with the primary wiring.

In this connection, the semiconductor film is formed in step (d) described above, however, the semiconductor film may be formed so that it can have the structure of SOI. In order to form the semiconductor film having the structure of SOI, first, an element side semiconductor substrate, on the surface of which an intermediate insulating film is formed, is prepared. Then, an intermediate insulating film side of the element side semiconductor substrate is stuck onto one of the faces of the support side semiconductor substrate. After that, the thickness of the element side semiconductor substrate is decreased, so that the element side semiconductor substrate can be formed into the above semiconductor film.

By the above steps, it is possible to form a semiconductor film of small thickness on the intermediate insulating film. This structure is the structure of SOI (Silicon On Insulator) itself. That is, the above intermediate insulating film functions as an embedding insulating film, and the above semiconductor film functions as a film of SOI.

A step of forming a surface flattening insulating film may be formed on one of the faces of the support side semiconductor substrate and also a step of forming a surface flattening insulating film may be provided before the semiconductor film is formed in the step of forming the semiconductor film (step (d) described above). Due to the foregoing, the semiconductor film can be formed on a flattened surface. Especially when the element side semiconductor substrate is stuck as described above, it is possible to stick the element side semiconductor substrate onto the surface flattening insulating film without leaving any gap between them.

In this connection, in the above case, the support side semiconductor substrate is used, however, like another method of manufacturing a semiconductor device of the present invention, it is possible to use the support side insulating substrate instead of the support side semiconductor substrate. In this case, after the first holes have been formed on the support side insulating substrate, it is possible to provide a step of forming a film for enhancing the adhesion property between the support side insulating substrate and the first metal on the side walls of the first holes. Due to the foregoing, it is possible to prevent the first metal from separating from the support side insulating substrate, so that the reliability of the wiring can be enhanced.

In a case in which either the support side semiconductor substrate or the support side insulating substrate is used, in the step of forming the primary connection plugs (step (c) described above), it is possible to provide a step, in which a barrier metal layer for covering exposed faces of the primary connection plugs is formed, after the primary connection plugs have been formed. When this barrier metal layer is formed, it is possible to prevent the first metal from diffusing from the primary connection plugs onto the film formed on the barrier metal layer.

According to still another aspect of the present invention, there is provided a semiconductor device comprising: a support side semiconductor substrate having a first hole penetrating thereof; a semiconductor film incorporated therewith an element, said semiconductor film having a second hole penetrating thereof and being laminated on said support side semiconductor substrate; a primary connecting plug comprising a first metal filled in said first hole; and an auxiliary connecting plug comprising a second metal filled in said second hole, said auxiliary connecting plug electrically connecting said primary connecting plug with said element.

According to further aspect of the present invention, there is provided a semiconductor device comprising: a support side insulating substrate having a first hole penetrating thereof; a semiconductor film incorporated therewith an element, said semiconductor film having a second hole penetrating thereof and being laminated on said support side insulating substrate; a primary connecting plug comprising a first metal filled in said first hole; and an auxiliary connecting plug comprising a second metal filled in said second hole, said auxiliary connecting plug electrically connecting said primary connecting plug with said element.

DETAILED DESCRIPTION OF THE PREFERRED EMBODIMENTS (1) First Embodiment

Referring to FIGS. 1(a) to 8, a method of manufacturing a semiconductor device of the first embodiment of the present invention will be explained below.

Figure 1A:
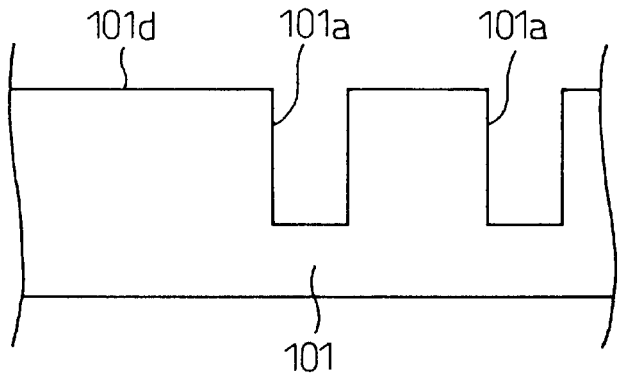
FIGS. 1(a) to 1(d) are cross-sectional views showing the first stage of a method of manufacturing a semiconductor device of the first embodiment of the present invention.

First, as shown in FIG. 1(a), the first holes 101a, 101a, ... not penetrating the support side silicon wafer 101 are formed on one face 101d of the support side silicon wafer 101 (support side semiconductor substrate). These first holes 101 are formed by a well-known technique such as laser beam machining, sand blasting and plasma etching, and the diameter of each hole 101a is approximately 5 to 100 μm and the depth of each hole 101a is approximately 5 to 500 μm.

Figure 1B:
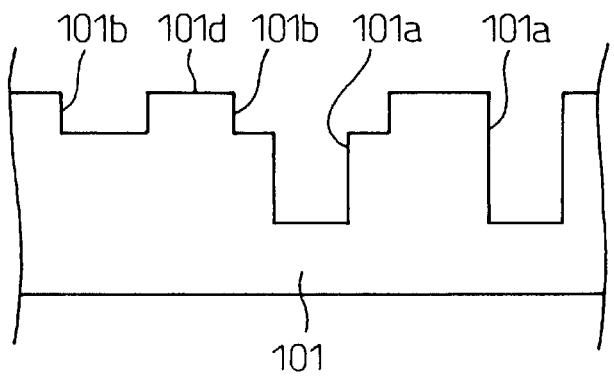

Next, as shown in FIG. 1(b), the wiring grooves 101b, 101b, ... are formed on one face 101d of the support side silicon wafer 101. As shown in the drawing, some of the wiring grooves 101b, 101b, ... are communicated with the first holes 101a, and others are isolated from the first holes 101a. In the same manner as that of the first holes 101a, these wiring grooves 101b are formed by a well-known technique such as laser beam machining, sand blasting and plasma etching. The depth of each wiring groove 101b is approximately 5 to 200 μm, and the width of each wiring groove 101b is approximately 1 to 100 μm.

In this connection, copper is charged into the wiring grooves 101b in the later step, and the wiring grooves 101b become the primary wiring. However, in the case where it unnecessary to provide the wiring, the wiring grooves 101b may not be formed.

Figure 1C:
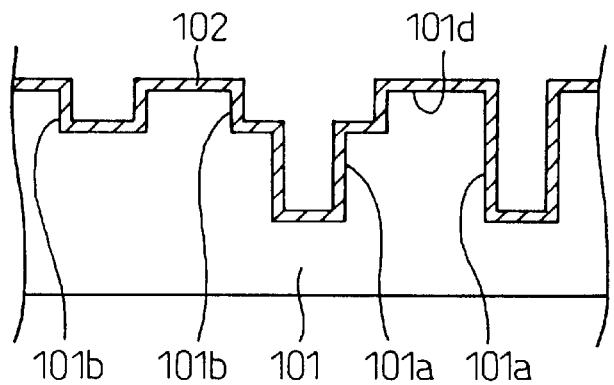

Next, as shown in FIG. 1(c), on one face 101d of the support side silicon wafer, the ground insulating film 102 made of $SiO_2$ is formed on the side walls and the bottom sections of the first holes 101a and also on the side walls and the bottom sections of the wiring grooves 101b. This ground insulating film 102 is formed by a CVD method (chemical vapor deposition method), and the film thickness is approximately 50 to 300 nm. In this connection, the ground insulating film 102 may be formed by the method of thermal oxidation instead of a CVD method.

As described later, copper is charged into the first holes 101a and the wiring grooves 101b. However, the ground insulating film 102 functions as an electrical insulator to insulate the copper from the support side silicon wafer 101.

Figure 1D:
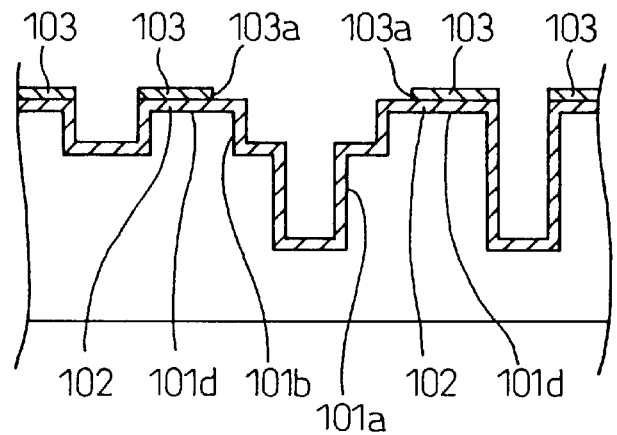

Next, as shown in FIG. 1(d), the wiring embedding insulating film 103 made of $SiO_2$ is formed on the ground insulating film 102 formed on one face 101d of the support side silicon wafer 101. The wiring embedding insulating film 103 is formed by CVD Method, and the film thickness of the wiring embedding insulating film 103 is approximately 10 to 5000 nm. As shown in the drawing, the opening sections 103a, 103a, ... for minute wiring are open onto the wiring embedding insulating film 103. Some of these opening sections 103a, 103a, ... for the minute wiring are communicated with the first holes 101a or the wiring grooves 101b, and others are independent from them. These opening sections 103a, 103a, ... for minute wiring are formed by means of patterning the wiring embedding insulating film 103.

Figure 2A:
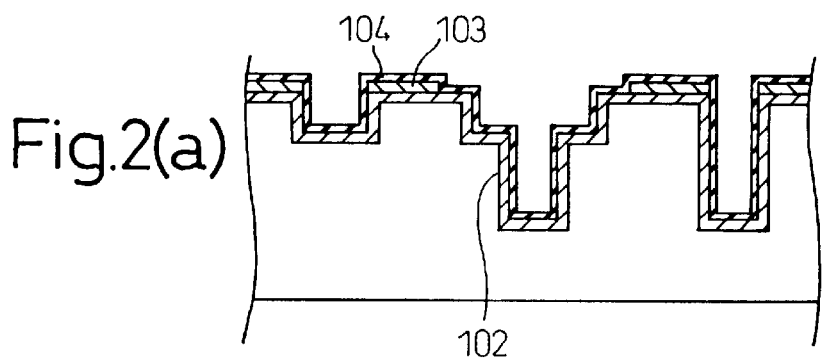
FIGS. 2(a) to 2(d) are cross-sectional views showing the second stage of a method of manufacture of the first embodiment of the present invention.

Next, as shown in FIG. 2(a), the plated feeder layer 104 is formed on the ground insulating film 102 and the wiring embedding insulating film 103. This plated feeder layer 104 is formed in such a manner that a copper film or chromium film (not shown in the drawing), the thickness of which is approximately 0.1 μm, is formed by means of sputtering and then an electroless copper plating film, the thickness of which is approximately 1 to 3 μm, is formed on this copper or chromium film.

Figure 2B:
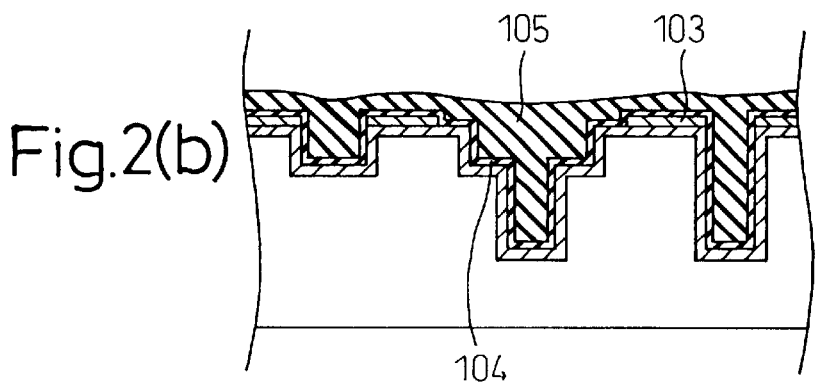

Next, as shown in FIG. 2(b), the electrolytic copper plating film 105 is formed on the plated feeder layer 104 concerned by supplying an electric current onto the plated feeder layer 104.

Figure 2C:
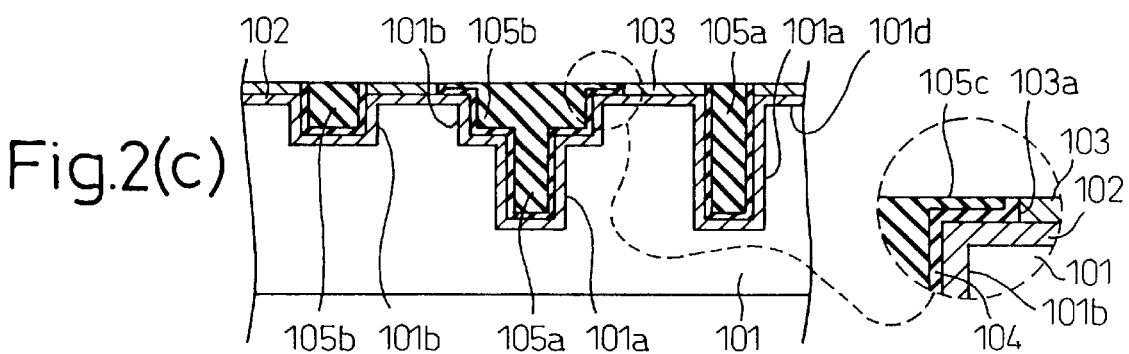

Next, as shown in FIG. 2(c), the plated feeder layer 104 and the electrolytic copper plating layer 105 are polished by the CMP method (chemical-mechanical polishing method) until a surface of the wiring embedding insulating film 103 is exposed. By the above steps, it is possible to complete the structure in which copper (the first metal) is charged into the first holes 101a, wiring grooves 101b and opening sections 103a for the minute wiring. In this way, the primary connection plugs 105a which are composed of copper charged into the first holes 101a, the primary wiring 105b which is composed of copper charged into the wiring grooves 101b, and the minute wiring 105c which is composed of copper charged into the opening sections 103a for the minute wiring are formed.

In this structure, the primary wiring 105b is embedded in the support side silicon wafer 101. Therefore, irregularities on the support side silicon wafer 101 are small compared with a case in which the wiring is formed on the support side silicon wafer 101. Due to the foregoing, the insulating film can be formed on the silicon wafer 101 without deteriorating the surface flatness. In this embodiment, as described later, the element side silicon wafer is stuck onto one face 101d of the support side silicon wafer 101. In this case of sticking the element side silicon wafer, when the surface flatness is good, the element side silicon wafer can be stuck with a high adhesion property.

On the other hand, when attention is given to the opening sections 103a for the fine wiring in which the minute wiring 105c is embedded (Refer to the circle of dotted-line shown in FIG. 2(c).), the opening sections 103a for the fine wiring are formed on the insulating film 103, in which the wiring is embedded, the thickness of which is remarkably smaller than that of the support side silicon wafer 101. Therefore, the opening sections 103a for the fine wiring are much more minute than the wiring groove 101b. Therefore, it is possible to realize a minute wiring 105c which cannot be realized by the primary wiring 105b. In this connection, in the case where such a minute wiring is unnecessary, the wiring embedding insulating film 103 may not be formed.

In this connection, instead of copper, it is possible to use tungsten, aluminum, tantalum, titanium, nickel and chromium as the first metal. In the case of using the above metals, an appropriate film forming method such as plating, flame coating or sputtering may be selected for each metal.

In this connection, in the structure described above, the primary connection plugs 105a and the primary wiring 105b are incorporated into the support side silicon wafer 101, however, capacitance elements may be further incorporated into the support side silicon wafer 101 when holes (not shown) for the capacitance elements are formed in the support side silicon wafer 101.

Figure 2D:
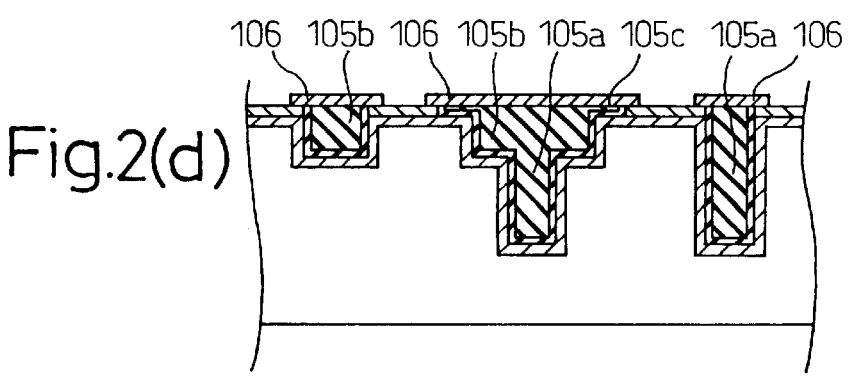

Next, as shown in FIG. 2(d), the barrier metal layer 106 is formed which covers the exposed faces of the primary connection plugs 105a, primary wiring 105b and minute wiring 105c. This barrier metal layer 106 is made of, for example, tantalum or tantalum oxide, and the film thickness is 50 to 500 nm. Sputtering is used to form the barrier metal layer 106.

Figure 3A:
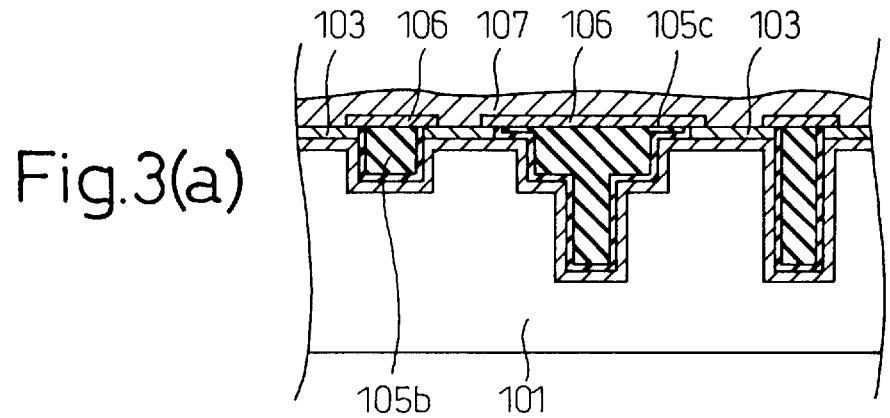
FIGS. 3(a) to 3(c) are cross-sectional views showing the third stage of a method of manufacture of the first embodiment of the present invention.

Next, as shown in FIG. 3(a), the coating glass film 107 (insulating film for flattening a surface) is formed on the wiring embedding insulating film 103 and the barrier metal layer 106.

In this case, as described before, the primary wiring 105b and the minute wiring 105c are respectively embedded in the support side silicon wafer 101 and the wiring embedding insulating film 103. Therefore, irregularities are seldom formed on the surface of the coating glass film 107 compared with a case in which the wiring is formed on the support side silicon wafer 101.

In addition to that, since the wiring can be easily embedded into the coating glass film 107, it is possible to obtain a substantially flat surface profile. The film thickness of this coating glass film 107 is approximately 0.1 to 3 μm.

Further, attention should be given to the fact that copper located below the barrier metal layer 106 is prevented from diffusing into the coating glass film 107 by the barrier metal layer 106 which has been formed before. Due to the foregoing, it is possible to prevent the occurrence of migration of copper into the coating glass film 107. In this connection, in the case where no problems are caused even if copper migrates into the coating glass film 107, the barrier metal 106 may be omitted. This coating glass film 107 may be formed by the CVD method.

Figure 3B:
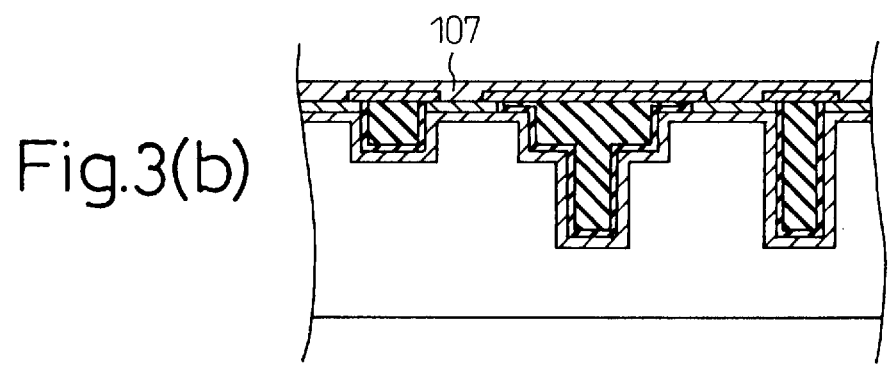

Next, as shown in FIG. 3(b), the coating glass film 107 is polished by the mechanical polishing method or the CMP method, so that the surface of the coating glass film 107 can be flattened. Since the surface profile of this coating glass film 107 is substantially flat as described above, a quantity of polishing in this process can be reduced. After the surface of the coating glass film 107 has been polished in this way, irregularities on the surface of the coating glass film 107 are reduced to a value of not more than 1 nm.

Figure 3C:
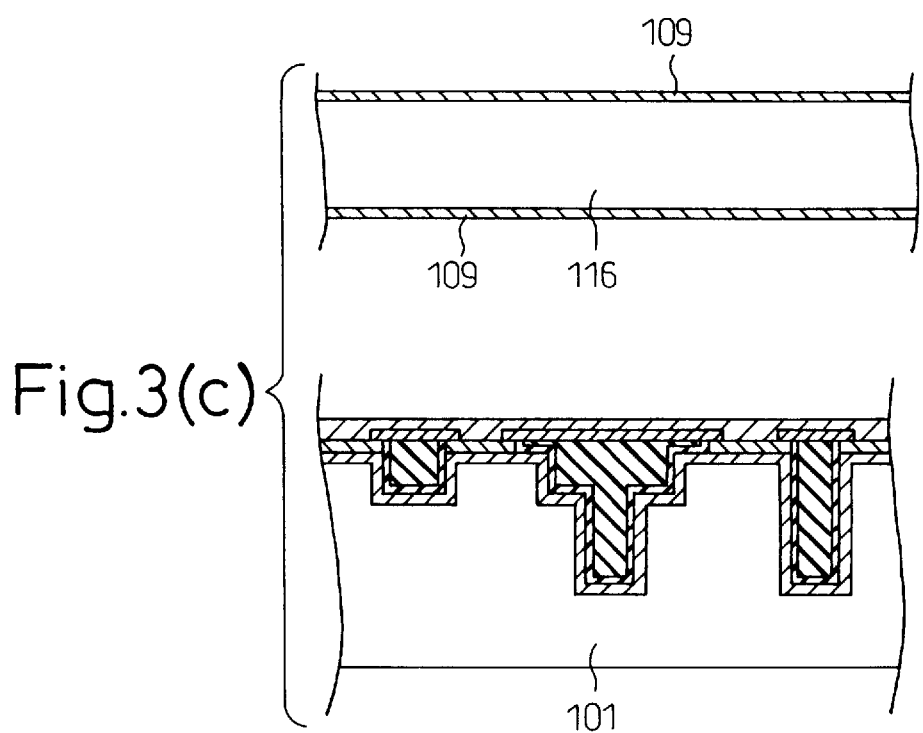

Next, as shown in FIG. 3(c), there is prepared a element side silicon wafer 116 (element side semiconductor substrate), on the surfaces of which the intermediate insulating films 109 made of $SiO_2$ are formed. The intermediate insulating films 109 are formed when the element side silicon wafer 116 is thermally oxidized, and the film thickness is approximately 50 nm to 400 nm. In this connection, in this embodiment, the intermediate insulating films 109 are formed on both faces of the element side silicon wafer 116, however, instead of that, it is possible to prepare an element side silicon wafer, on only one face of which the intermediate insulating film 109 is formed.

Figure 4A:
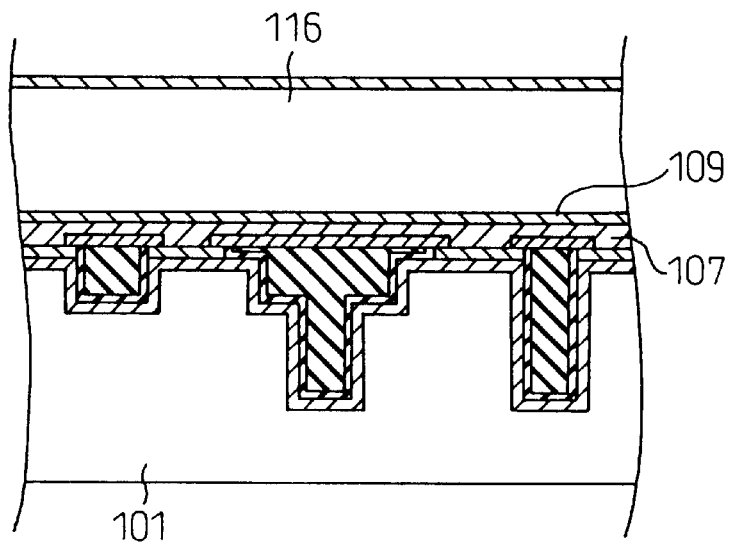
FIGS. 4(a) to 4(c) are cross-sectional views showing the fourth stage of a method of manufacture of the first embodiment of the present invention.

Next, as shown in FIG. 4(a), the element side silicon wafer 116 is stuck onto one face of the support side silicon wafer 101. In the case of using the element side silicon wafer, on only one face of which the intermediate insulating film 109 is formed, the intermediate insulating film side of the element side silicon wafer is stuck onto one face side of the support side silicon wafer 101.

In this case, sticking is conducted as follows. After the element side silicon wafer 116 has been placed on one face side of the support side silicon wafer 101, the wafer is annealed.

In this case, attention should be given to the following. In the process shown in FIG. 3(b), the surface of the coating glass film 107 has been flattened. Due to the foregoing, when the above sticking is conducted, no gap is formed between the support side silicon wafer 101 and the element side silicon wafer 116, so that they can be closely stuck to each other.

Figure 4B:
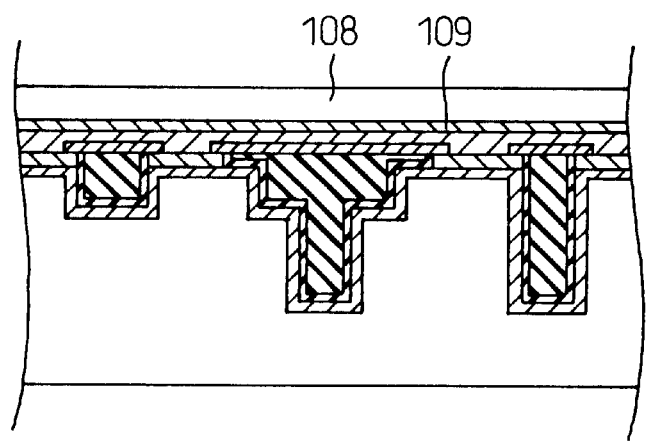

Next, as shown in FIG. 4(b), the element side silicon wafer 116 is polished by the CMP method, and the thickness is reduced to about 0.5 to 50 μm. The element side silicon wafer 116, the thickness of which has been reduced as described above, is referred to as a semiconductor film 108 hereinafter. In this case, attention should be give to that SOI structure is composed of this semiconductor film 108 and the intermediate insulating film 109. That is, the intermediate insulating film 109 functions as an embedding oxide film, and the semiconductor film 108 functions as SOI film.

Figure 8:
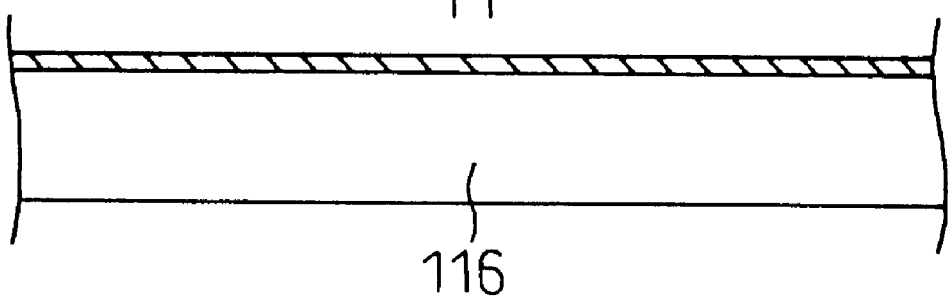
FIG. 8 is a cross-sectional view showing another example of a method of manufacturing a semiconductor device of the first embodiment of the present invention.
Figure 8:
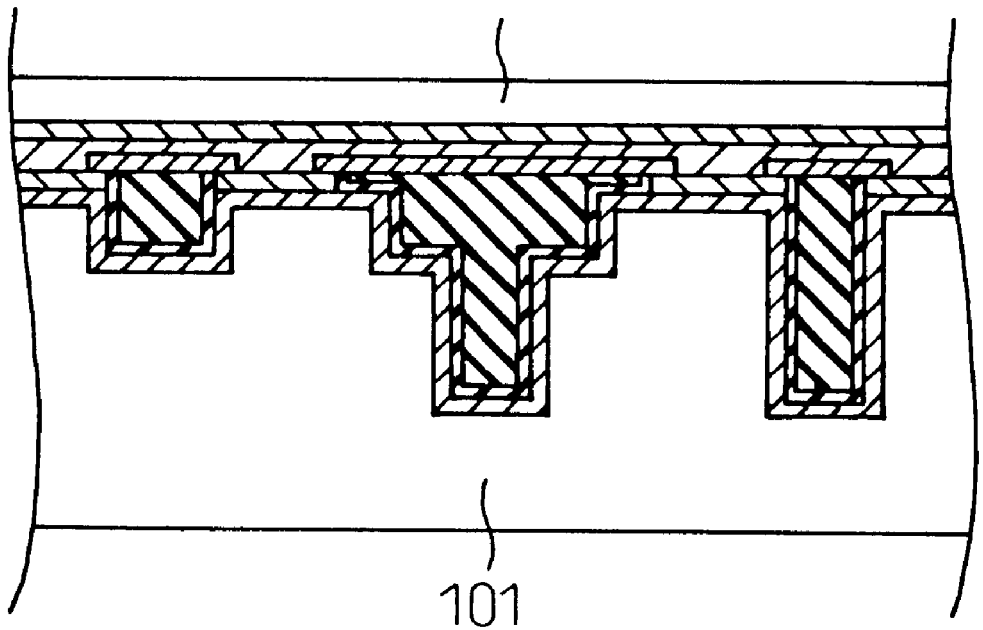

In this connection, in order to reduce the thickness of the element side silicon wafer 116, the element side silicon wafer 116 may be divided into two in the thickness direction by the well-known wafer separation method as shown in FIG. 8. An example of the well-known wafer separation method is a method in which a jet of water is applied to the element side silicon wafer 116 from its side, so that the element side silicon wafer 116 is divided into two in the thickness direction.

When the element side silicon wafer 116 is divided into two as described above, the element side silicon wafer 116, which has been separated from the support side silicon wafer 101, can be recycled to the process shown in FIG. 1(a), which can reduce the cost of the support side silicon wafer 101.

After the semiconductor film 108 has been formed as described above, the process shown in FIG. 4(c) is executed. In this process, elements such as transistors and others are formed on the semiconductor film 108. In the drawing, reference numeral 108a represents a layer onto which the above elements are incorporated. Reference numeral 108a is referred hereinafter to as an element forming layer, and it surface is referred to as an element forming face 108b hereinafter. As described before, the semiconductor film 108 functions as SOI film. Therefore, it is possible that an element, the parasitic capacitance with the semiconductor film 108 of which is suppressed, can be formed on the element forming layer 108a.

Figure 4C:
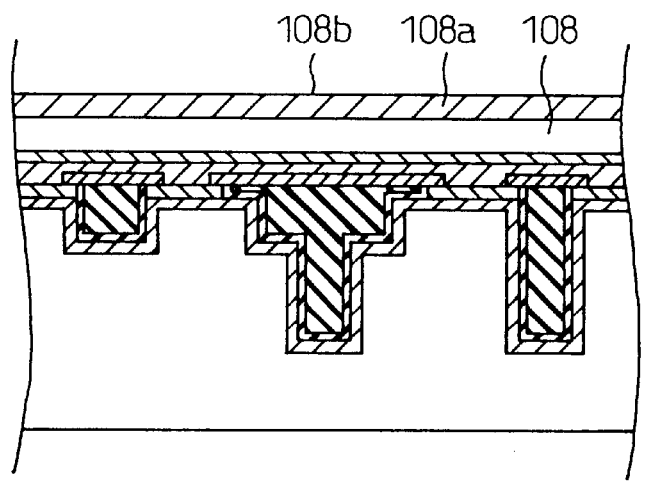

In this connection, instead of the process of forming the semiconductor film 108 (shown in FIGS. 3(c) to 4(b)) and also instead of the process of forming elements on the semiconductor film 108 (shown in FIG. 4(c)), the following process may be executed. That is, there is prepared a silicon wafer (not shown), on one face of which the semiconductor element is formed, and a reverse face of the silicon wafer (a face on which the semiconductor element is not formed) may be made to adhere onto the coating glass film 107, the surface of which is flattened, by adhesive.

Figure 5A:
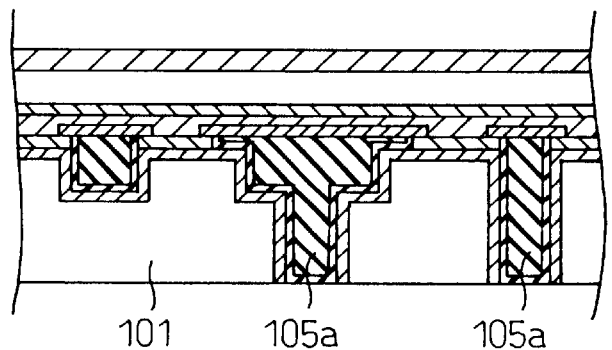
FIGS. 5(a) to 5(d) are cross-sectional views showing the fifth stage of a method of manufacture of the first embodiment of the present invention.

Successively, as shown in FIG. 5(a), the other face of the support side silicon wafer 101 is polished by the mechanical polishing method or the CMP method, so that the bottom faces of the primary connection plugs 105a can be exposed.

Figure 5B:
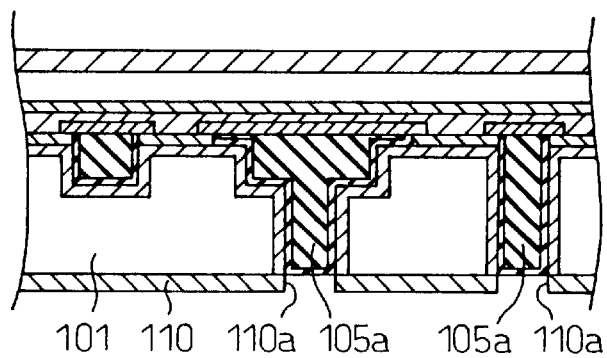

Next, as shown in FIG. 5(b), the surface insulating film 110 made of $SiO_2$ is formed the other face of the support side silicon wafer 101. This surface insulating film 110 is usually formed by the CVD method, and the film thickness is approximately 10 to 5000 nm. After that, this surface insulating film 110 is subjected to patterning so as to form the opening sections 110a at positions corresponding to the primary plugs 105a.

Figure 5C:
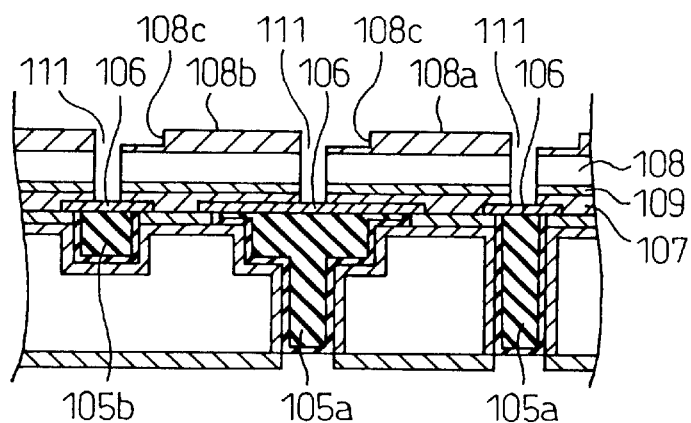

Next, as shown in FIG. 5(c), the second holes 111, 111, . . . , which extend from the element forming face 108b to the barrier metal layer 106, are formed by etching. In this connection, as explained before, the barrier metal layer 106 is made of tantalum or tantalum oxide. In the case where the barrier metal layer 106 is made of dielectrics such as tantalum oxide, the barrier metal layer 106 is also etched, so that the second holes 111, 111, . . . can reach the primary connection plugs 105a and the primary wiring 105b.

In the case where the barrier metal layer 106 is not formed, the second holes 111 are formed so that they can reach the primary plugs 105a and the primary wiring 105b. As shown in the drawing, the second holes 111 are formed so that they can penetrate different components such as a coating glass film 107, intermediate insulating film 109 and semiconductor film 108. In this case, the aforementioned second holes 111 are formed when the most appropriate well-known etching technique is selected for each component.

After the second holes 111 are formed, the recess sections 108c communicating with the second holes 111 are formed on the element forming layer 108a by means of etching. Although not shown in the drawing, the element forming layer 108a is provided with an interlayer insulating film and wiring layer which are formed by laminating various films. When the most appropriate well-known etching technique for each film is used, the recess sections 108c are formed. Although not shown in the drawing, each recess section 108c is formed so that the wiring layer of the element forming layer 108a can be exposed onto the side wall or the bottom face of the recess section 108c.

Figure 5D:
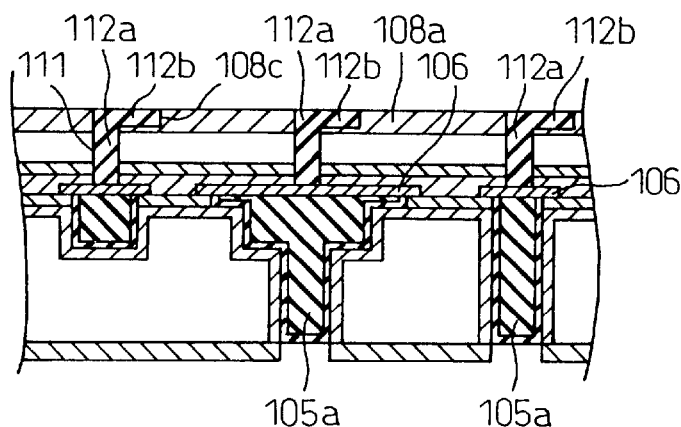

Next, as shown in FIG. 5(d), copper, which is an example of the second metal, is charged into the second holes 111 and the recess sections 108c.

In this case, copper is charged as follows. First, a feeder layer (not shown) is formed on the element forming face 108b and the side walls and the bottom sections of the second holes 111 and the recess sections 108c by means of sputtering or electroless copper plating. When an electric current is supplied to this plated feeder layer, an electrolytic copper plating layer (not shown) is formed on the plated feeder layer until the second holes 111 and the recess sections 108c are filled with copper. After that, the plated feeder layer and the electrolytic copper plating film, which are formed on the element forming face 108b, are removed by polishing using the CMP method. In this way, the structure shown in FIG. 5(d) is completed.

In this specification, a piece of copper charged into the second hole 111 is referred to as an auxiliary connection plug 112a hereinafter, and a piece of copper charged in the recess section is referred to as an upper electrode pad 112b hereinafter.

As described above, the recess sections 108c are formed so that the wiring layer of the element forming layer 108a can be exposed onto the side walls and the bottom faces. Therefore, the elements on the element forming layer 108a are electrically connected with the upper electrode pads 112b and the auxiliary connection plug 112a. Further, the auxiliary connection plug 112a are electrically connected with the primary connection plugs 105a via the barrier metal layer 106. Therefore, the elements on the element forming layer 108a are electrically connected with the primary connection plugs 105a.

In this connection, in this embodiment, copper is used as the second metal, however, instead of copper, it is possible to use tungsten, aluminum, tantalum, titanium, nickel and chromium as the second metal.

Figure 6A:
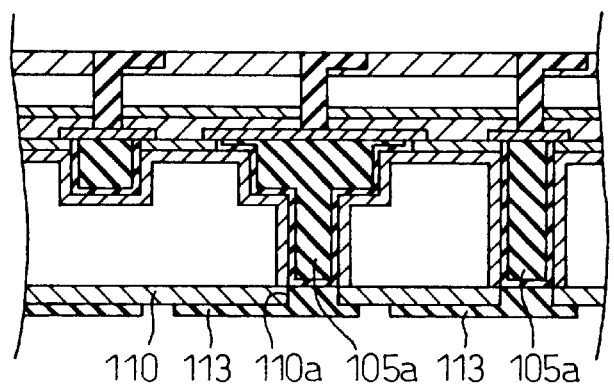
FIGS. 6(a) to 6(c) are cross-sectional views showing the sixth stage of a method of manufacture of the first embodiment of the present invention.

Next, as shown in FIG. 6(a), the lower electrode pads 113, 113, . . . made of copper are formed on the surface insulating film 110. These lower electrode pads 113, 113, . . . are formed by the subtractive method, the semi-additive method or the full-additive method. Accordingly, the lower electrode pads 113, 113, . . . are electrically connected with the primary connection plugs 105a via the opening sections 110a of the surface insulating film 110.

Figure 6B:
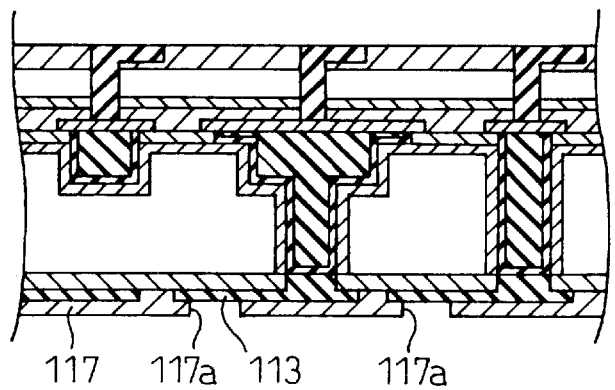

Successively, as shown in FIG. 6(b), the solder resist 117 is coated on the surface insulating layer 110 and the lower electrode 113. This solder resist 117 has opening sections 117a to which the surfaces of the lower electrode pads 113 are exposed.

Figure 6C:
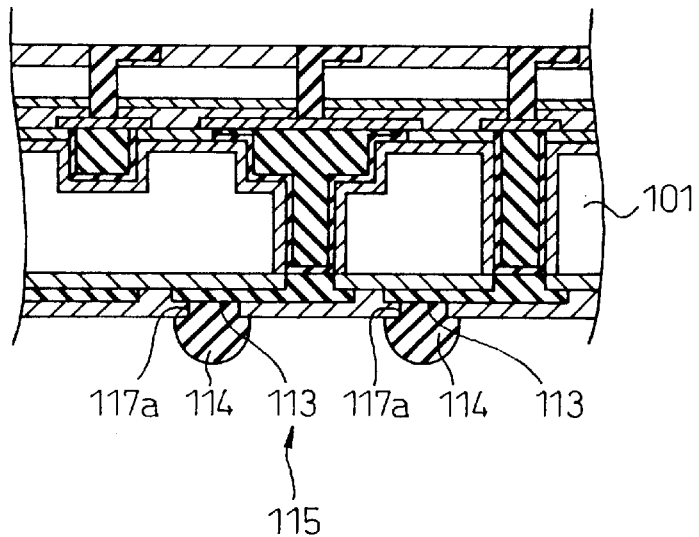

Next, as shown in FIG. 6(c), the solder bumps 114, 114, . . . are mounted on the lower electrode pads 113, 113, . . . via the opening sections 117a. Although not shown in the drawing, at the stage of completion of this process, a plurality of semiconductor devices 115, 115, . . . , which have been made by the method of manufacturing a semiconductor device of the present embodiment, are formed on one sheet of support side silicon wafer 101.

After that, the semiconductor devices 115, 115, . . . are made to be individual pieces by dicing. After the semiconductor devices 115, 115, . . . have been made to be individual pieces, they are mounted on a mounting substrate (not shown) such as a mother board via the solder bumps 114, 114, . . . which are provided in each semiconductor device 115.

In this connection, the semiconductor device 115 manufactured by the method of the present embodiment may be used as a single body. Alternatively, as shown in FIG. 7, a plurality of semiconductor devices 115 may be laminated in the vertical direction as shown in FIG. 7 so that they can be formed into a three-dimensional mounting structure.

Figure 7:
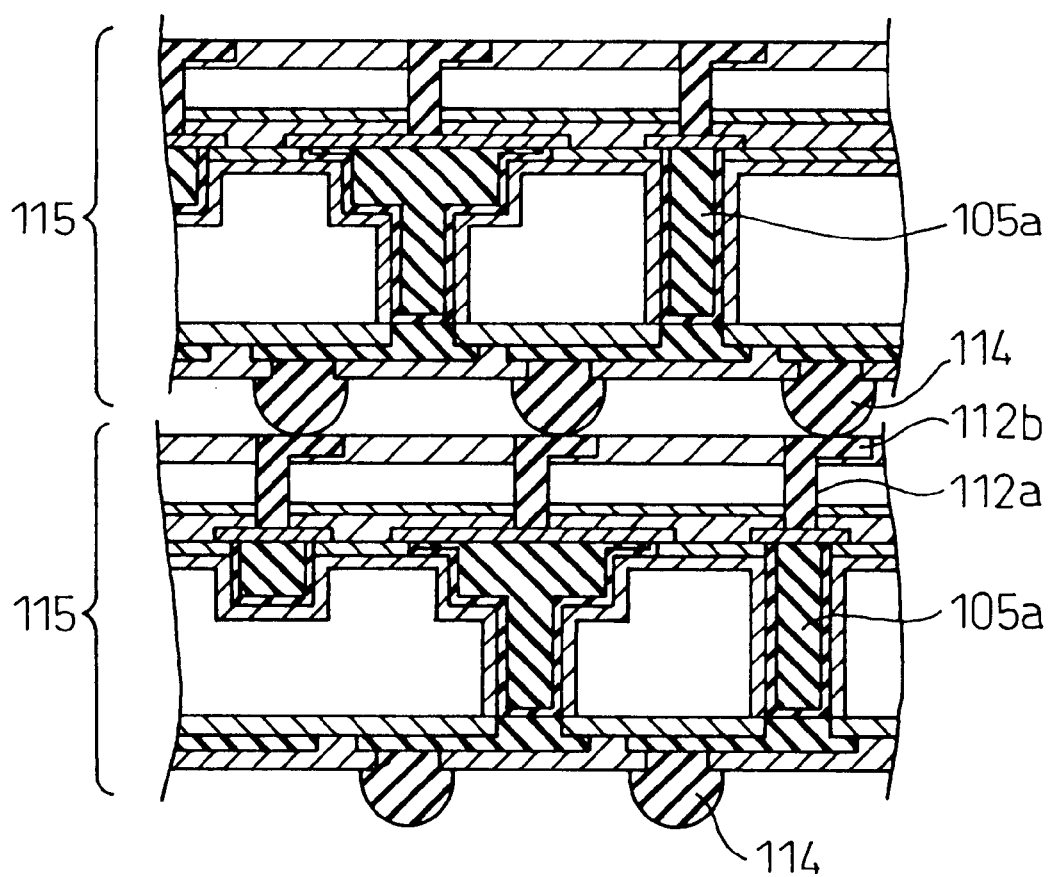
FIG. 7 is cross-sectional views showing the seventh stage of a method of manufacture of the first embodiment of the present invention.

Referring to FIG. 7, when attention is given to the semiconductor devices 115, 115 which are adjacent to each other in the vertical direction, the solder bumps 114 provided in the upper side semiconductor device 115 are joined to the upper section electrode pads 112b provided in the lower side semiconductor device 115. Accordingly, in this structure, the primary connection plugs 105a of the upper side semiconductor device 115 are electrically connected with the auxiliary connection plugs 112a of the lower side semiconductor device 115.

When the semiconductor devices 115, 115 are laminated as described above so that they can be formed into a three-dimensional mounting structure, the mounting area can be reduced to be smaller than that in a case in which the semiconductor devices 115, 115 are arranged on the same one plane, which can greatly contribute to the downsizing of electronic equipment which has been recently demanded.

According to the method of manufacturing a semiconductor device of the present embodiment, the process (shown in FIG. 4(c)) of forming elements is executed after the process (shown in FIG. 1(a)) of forming the first holes 101a used for the primary connection plugs 105a. In the present embodiment, the depth of the first hole 101a is approximately 5 to 500 μm, that is, the depth of the first hole 101a is deep, however, as the elements are formed after the first holes 101a have been formed, the elements are not damaged even when the first holes 101a are formed.

On the other hand, the process (shown in FIG. 5(c)) of forming the second holes 111 used for the auxiliary connection plugs 112a is executed after the process of forming the elements, however, as the depth of the second hole is approximately 0.5 to 20 μm, that is, as the common depth of the second hole is about 5 μm depending upon the element side silicon wafer 116, that is, as the depth of the second hole is shallow, there is no possibility that the elements are damaged even when these shallow holes are formed after the elements have been formed.

As described above, in this embodiment, no elements are damaged when the holes are formed. Accordingly, the yield of manufacturing the semiconductor device can be enhanced as compared with a case in which the semiconductor devices are manufactured by the conventional method.

FIG. 8 is a view showing an embodiment which is obtained when a portion of the first embodiment described before is changed as follows. In the process shown in FIG. 4(a), after the element side silicon wafer 116 has been stuck onto one face side of the support side silicon wafer 101, the element side silicon wafer 116 is separated without conducting polishing like the process shown in FIG. 4(b), and the semiconductor film 108, the thickness of which is approximately 0.05 to 0.1 μm, is left on one face side of the support side silicon wafer 101.

(2) Second Embodiment

Next, referring to FIG. 9, explanations will be made into a method of manufacturing a semiconductor device of the second embodiment of the present invention.

The points of this embodiment different from the first embodiment are the processes shown in FIGS. 1(a) to 1(c), and other processes of this embodiment are the same as those of the first embodiment.

Figure 9A:
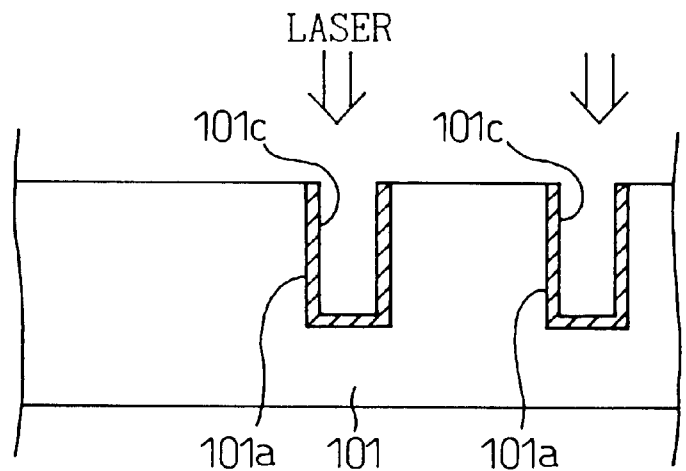
FIGS. 9(a) to 9(c) are cross-sectional views showing a method of manufacturing a semiconductor device of the second embodiment of the present invention.

In this embodiment, first, as shown in FIG. 9(a), when the element side silicon wafer 101 is irradiated with a laser beam in an atmosphere of oxygen, the first holes 101a are formed. At this time, since the side walls and the bottom sections of the first holes 101a are heated in an atmosphere of oxygen, silicon in these portions is oxidized, and the thermally oxidized film 101c grows.

Figure 9B:
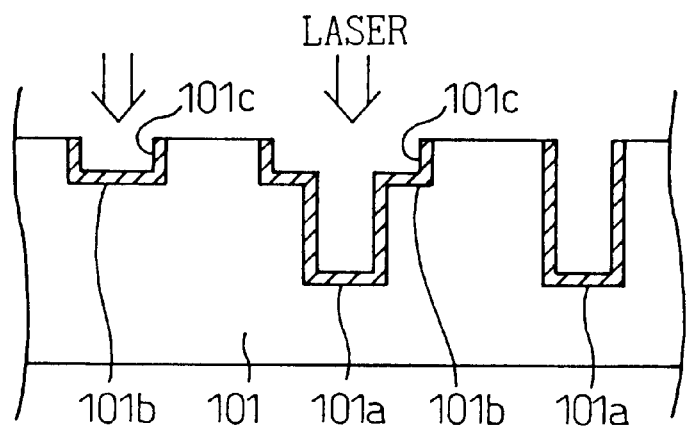

Next, as shown in FIG. 9(b), when laser beam irradiation is executed in the atmosphere of oxygen in the same manner as described above, the wiring grooves 101b are formed. In this process, the thermally oxidized film 101c grows on the side walls and in the bottom sections of the wiring grooves 101b.

In this case, in the process of forming the first holes 101a and the wiring grooves 101b, the thermal oxidation film 101c is formed simultaneously with the formation of the first holes 101a and the wiring grooves 101b. In this case, attention should be given to the fact that this thermal oxidation film 101c is provided with the same function as that of the ground insulating film 102 in the first embodiment. That is, the thermal oxidation film 101c functions as a film which electrically insulates the primary connection plugs 105a and the primary wiring 105b (shown in FIG. 2(c)) from the support side silicon wafer 101.

Figure 9C:
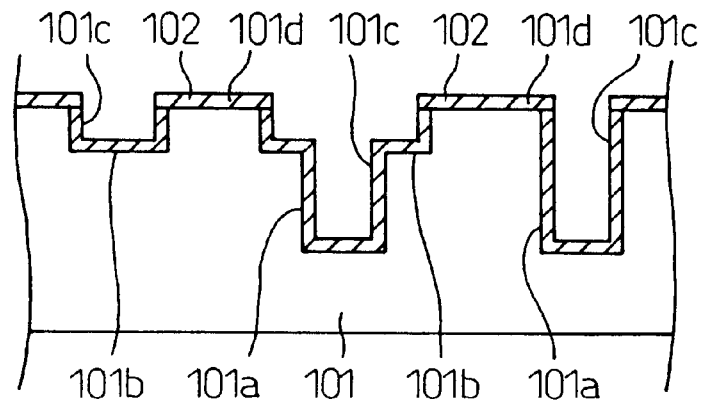

Next, as shown in FIG. 9(c), the ground insulating film 102 made of $SiO_2$ is formed only on one face 101d of the support side silicon wafer 101. Since the thermal oxidation film 101c has already been formed in the first holes 101a and the wiring grooves 101b, it is unnecessary to form the ground insulating film 102 in these portions.

This ground insulating film 102 may be formed by either the thermal oxidation method or the CVD method, and its film thickness is approximately 50 to 300 nm.

After that, the semiconductor device 115 (shown in FIG. 6(c)) is completed through the processes after the process shown in FIG. 1(d) explained in the first embodiment.

According to the method of manufacturing a semiconductor device of this embodiment, the first holes 101a and the wiring grooves 101b are formed by the irradiation of laser beams in the atmosphere of oxygen. Due to the foregoing, thermal oxidation film 101c is formed on the side walls and in the bottom sections of the first holes 101a and the wiring grooves 101b. Therefore, the ground insulating film 102 may be formed only on one face 101d of the support side silicon wafer 101. Due to the foregoing, compared with the first embodiment in which the ground insulating film 102 is also formed in the first holes 101a and the wiring grooves 101b, the present embodiment is advantageous in that the cost of forming the ground insulating film 102 can be reduced.

(3) Third Embodiment

Next, referring to FIG. 10(a) to FIG. 17(b), a method of manufacturing a semiconductor device of the third embodiment of the present invention will be explained below.

Different from the first and the second embodiment, the present embodiment uses a glass substrate 201 on the support side instead of the silicon wafer 101.

Figure 10A:
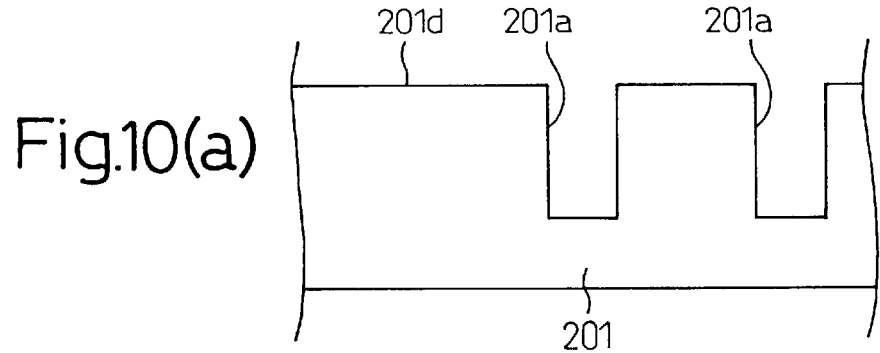
FIGS. 10(a) to 10(d) are cross-sectional views showing the first stage of a method of manufacturing a semiconductor device of the third embodiment of the present invention.

First of all, as shown in FIG. 10(a), on one face 201d of the support side glass substrate 201 (support side insulating substrate), the first holes 201a, 210a, . . . not penetrating the support side glass substrate 201 are formed. These first holes 201a, 210a, . . . are formed by a well-known technique such as laser beam machining, sand blasting or plasma etching. The diameter of each hole is approximately 5 to 200 μm, and the depth is approximately 5 to 500 μm.

Figure 10B:
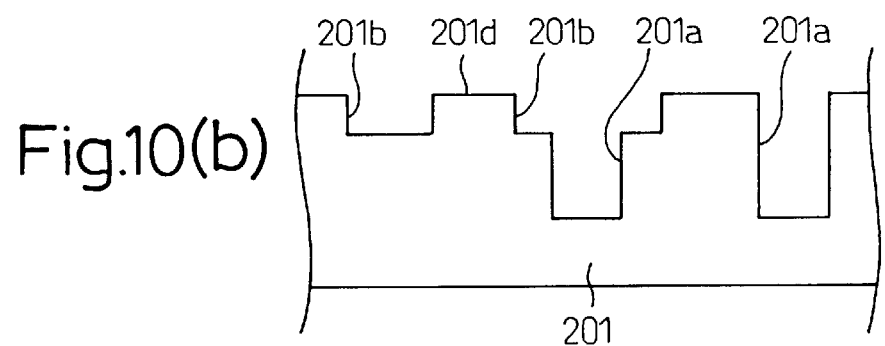

Next, as shown in FIG. 10(b), the wiring grooves 201b, 201b, . . . are formed on one face 201d of the support side glass substrate 201. As shown in the drawing, some of the wiring grooves 201b, 201b, . . . are communicated with the first holes 201a, and others are isolated from the first holes 201a. In the same manner as that of the first holes 201a, these wiring grooves 201b are formed by the method of well known technique such as laser beam machining, sand blasting and plasma etching. The depth of each wiring groove 201b is approximately 5 to 200 μm and the width of each wiring groove 201b is approximately 1 to 100 μm.

In this connection, copper is charged into the wiring grooves 201b in the same manner as that of the first embodiment, and the wiring grooves 201b become the primary wiring. However, in the case where it unnecessary to provide the wiring, the wiring grooves 201b may not be formed.

Figure 10C:
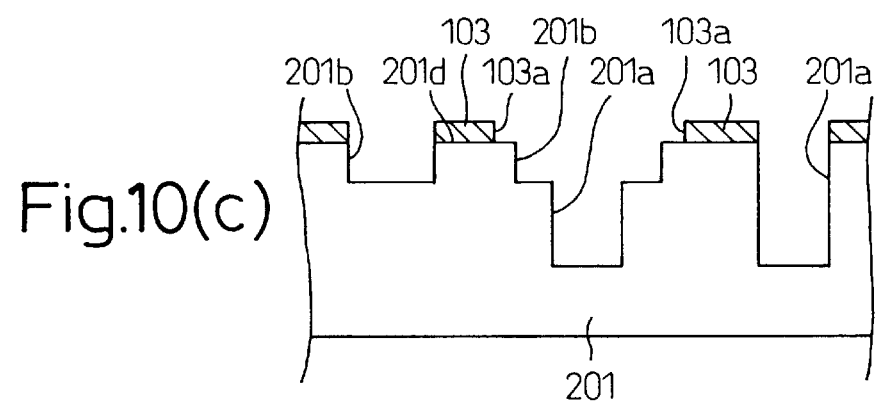

Successively, as shown in FIG. 10(c), the wiring embedding insulating film 103 made of SiO$_2$ is formed on one face 201d of the support side glass substrate 201. The wiring embedding insulating film 103 is formed by the CVD method, and its film thickness is approximately 10 to 5000 nm. As shown in the drawing, the minute wiring opening sections 103a, 103a, . . . are open onto the wiring embedding insulating film 103. Some of these opening sections 103a, 103a, . . . for the minute wiring are communicated with the first holes 201a or the wiring grooves 202b, and others are independent from them. These the minute wiring opening sections 103a, 103a, . . . are formed by means of patterning the wiring embedding insulating film 103.

Figure 10D:
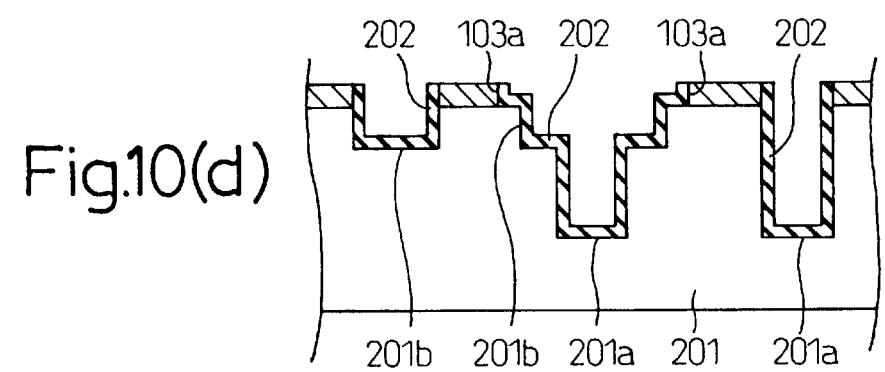

Next, as shown in FIG. 10(d), the glass adherence film 202 is formed on the side walls and in the bottom sections of the first holes 201a and the wiring grooves 201b and also on the side walls of the minute wiring opening sections 103a. In the same manner as that of the first embodiment, copper (the first metal) is charged into the first holes 201a, the wiring grooves 201b and the minute wiring opening sections 103a in the later process. The support side glass substrate 201 can be made to closely adhere to copper by the glass adherence film 202. Due to the foregoing, it is possible to prevent copper from peeling off from the support side glass substrate 201, and the reliability can be enhanced.

This glass adherence film 202 is made of chromium and tantalum and formed by means of plating, flame coating or sputtering.

Figure 11A:
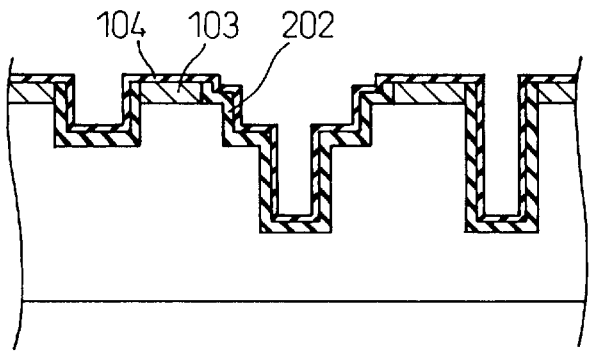
FIGS. 11(a) to 11(d) are cross-sectional views showing the second stage of a method of manufacturing a semiconductor device of the third embodiment of the present invention.

Next, as shown in FIG. 11(a), the plating feeder layer 104 is formed on the glass adherence film 202 and the wiring embedding insulating film 103. This plating feeder layer 104 is formed in such a manner that a copper film or chromium film (not shown in the drawing), the film thickness of which is approximately 0.1 μm, is formed by means of sputtering and then an electroless copper plating film, the thickness of which is approximately 1 to 3 μm, is formed on this copper or chromium film.

Figure 11B:
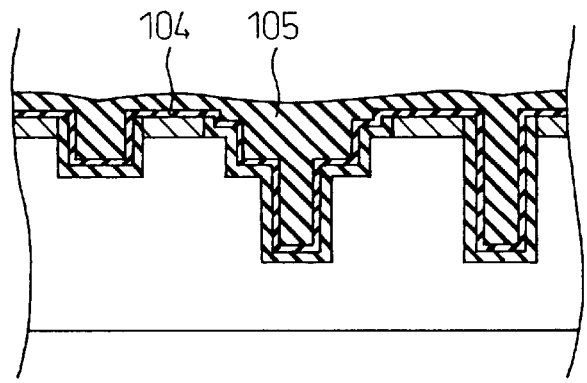

Successively, as shown in FIG. 11(b), an electric current is supplied to the plating feeder layer 104 so as to form the electrolytic copper plating film 105 on the plating feeder layer 104 concerned.

Figure 11C:
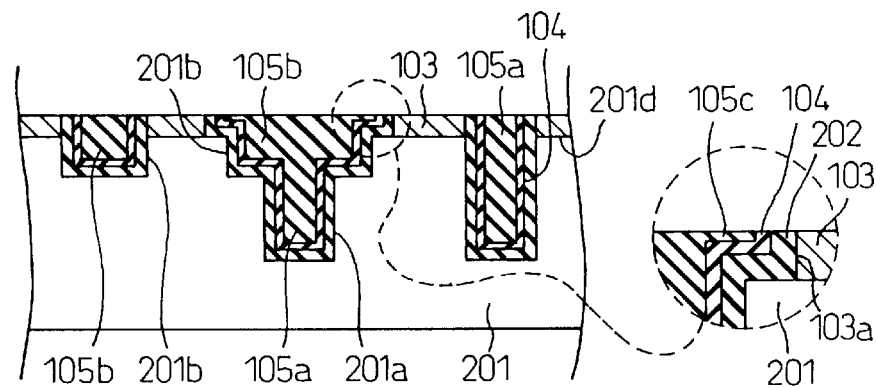

Next, as shown in FIG. 11(c), the plated feeder layer 104 and the electrolytic copper plating layer 105 are polished by the CMP method until a surface of the wiring embedding insulating film 103 is exposed. By the above steps, it is possible to complete the structure in which copper (the first metal) is charged into the first holes 201a, wiring grooves 201b and minute wiring opening sections 103a. In this way, the primary connection plugs 105a which are composed of copper charged into the first holes 201a, the primary wiring 105b which is composed of copper charged into the wiring grooves 201b, and the minute wiring 105c which is composed of copper charged into the minute wiring opening sections 103a are formed.

In the same manner as that of the first embodiment, the primary wiring 105b is embedded in the support side glass substrate 201. Therefore, irregularities on the support side glass substrate 201 are small compared with a case in which the wiring is formed on the support side glass substrate 201. Due to the foregoing, the insulating film can be formed on the glass substrate 201 without deteriorating the surface flatness.

When the surface flatness is high as described above, it is possible to highly closely stack the element side silicon wafer onto one face of the support side glass substrate 201 in the later process.

On the other hand, when attention is given to the opening section 103a for minute wiring in which the minute wiring 105c is embedded (Refer to the circle of dotted-line shown in FIG. 11(c).), the opening section 103a for minute wiring is formed on the insulating film 103, in which the wiring is embedded, the thickness of which is remarkably smaller than that of the support side glass substrate 201. Therefore, the opening section 103a for minute wiring is much more minute than the wiring groove 201b. Therefore, it is possible to realize a minute wiring 105c which cannot be realized by the primary wiring 105b. In this connection, in the case where such a minute wiring is unnecessary, the wiring embedding insulating film 103 may not be formed.

In this connection, instead of copper, it is possible to use tungsten, aluminum, tantalum, titanium, nickel and chromium as the first metal. In the case of using the above metals, an appropriate film forming method such as plating, flame coating or sputtering may be selected for each metal.

In this connection, in the structure described above, the primary connection plug 105a and the primary wiring 105b are incorporated into the support side glass substrate 201, however, capacitance elements may be further incorporated into the support side glass substrate 201 when holes (not shown) for the capacitance elements are formed on the support side glass substrate 201.

Figure 11D:
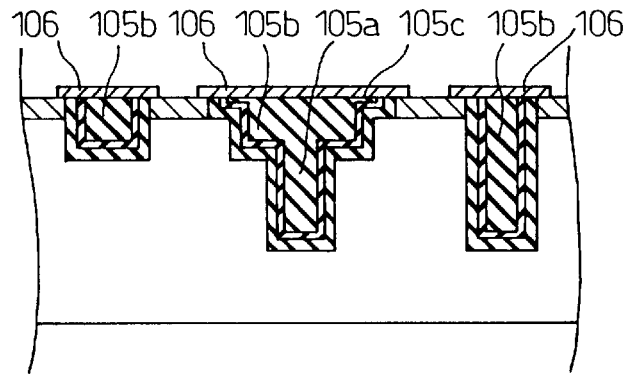

Next, as shown in FIG. 11(d), the barrier metal layer 106 is formed which covers the exposed faces of the primary connection plugs 105a, primary wiring 105b and minute wiring 105c. This barrier metal layer 106 is made of, for example, tantalum or tantalum oxide, and the film thickness is 50 to 500 nm. Sputtering is used to form the barrier metal layer 106.

Figure 12A:
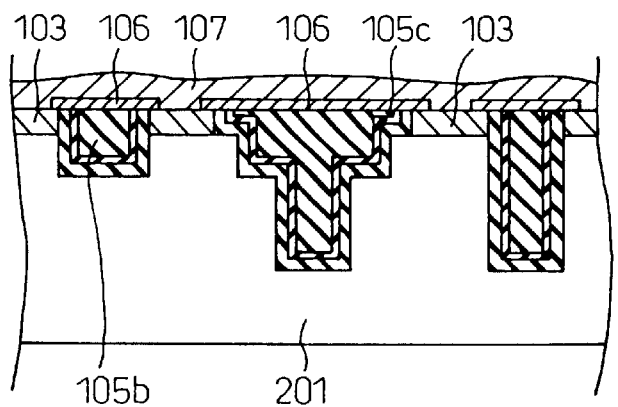
FIGS. 12(a) to 12(c) are cross-sectional views showing the third stage of a method of manufacturing a semiconductor device of the third embodiment of the present invention.

Next, as shown in FIG. 12(a), the coating glass film 107 (surface flattening insulating film) is formed on the wiring embedding insulating film 103 and the barrier metal layer 106.

In this case, as described before, the primary wiring 105b and the minute wiring 105c are respectively embedded on the support side glass substrate 201 and the wiring embedding insulating film 103. Therefore, irregularities are seldom formed on the surface of the coating glass film 107 compared with a case in which the wiring is formed on the support side glass substrate 101.

As explained in the first embodiment, as the wiring can be easily embedded into the coating glass film 107, it is possible to obtain a substantially flat surface profile, wherein the surface profile is seldom affected by the irregularities on the ground layer. Therefore, it is possible to obtain a substantially flat surface profile. Film thickness of this coating glass film 107 is approximately 0.1 to 3 μm.

Further, copper located below the barrier metal layer 106 is prevented from diffusing into the coating glass film 107 by the barrier metal layer 106 which has been formed before. Due to the foregoing, it is possible to prevent the occurrence of migration of copper into the coating glass film 107. In this connection, in the case where no problems are caused even if copper migrates into the coating glass film 107, the barrier metal 106 may be omitted.

Figure 12B:
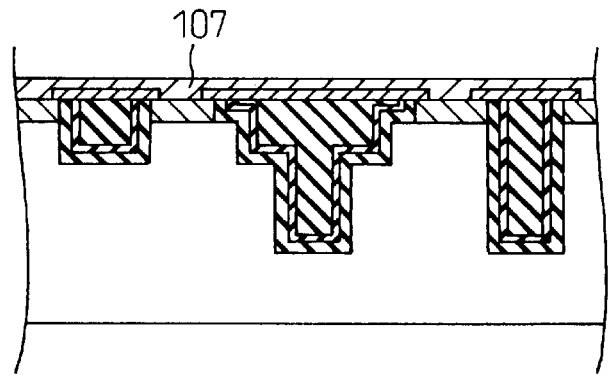

Next, as shown in FIG. 12(b), the coating glass film 107 is polished by the mechanical polishing method or the CMP method, so that the surface of the coating glass film 107 can be flattened. Since the surface profile of this coating glass film 107 is substantially flat as described above, a quantity of polishing in this process can be reduced. After the surface of the coating glass film 107 has been polished in this way, irregularities on the surface of the coating glass film 107 are reduced to a value of not more than 1 nm.

Figure 12C:
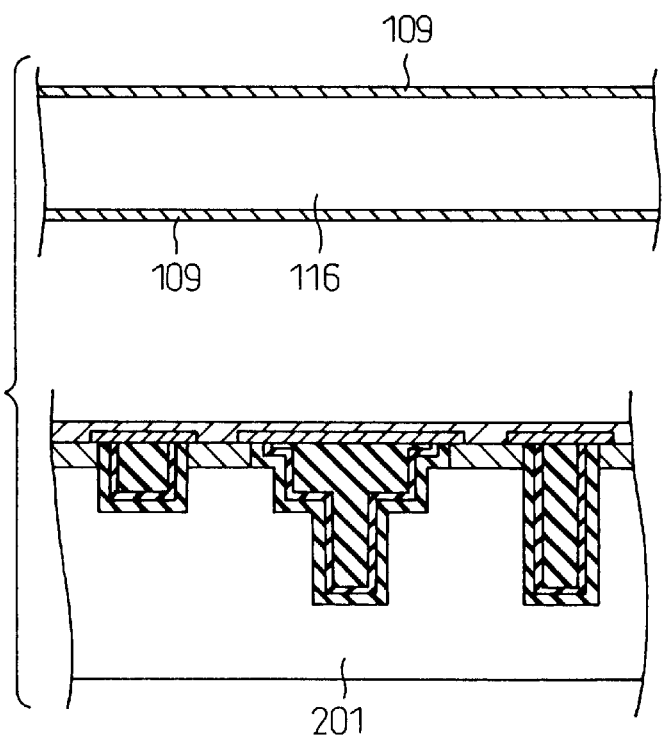

Next, as shown in FIG. 12(c), there is prepared a element side silicon wafer 116 (element side semiconductor substrate), on the surfaces of which the intermediate insulating films 109 made of $SiO_2$ are formed. The intermediate insulating films 109 are formed when the element side silicon wafer 116 is thermally oxidized, and the film thickness is approximately 50 nm to 400 nm. In this connection, in this embodiment, the intermediate insulating films 109 are formed on both faces of the element side silicon wafer 116, however, instead of that, it is possible to prepare an element side silicon wafer, on only one face of which the intermediate insulating film 109 is formed.

Figure 13A:
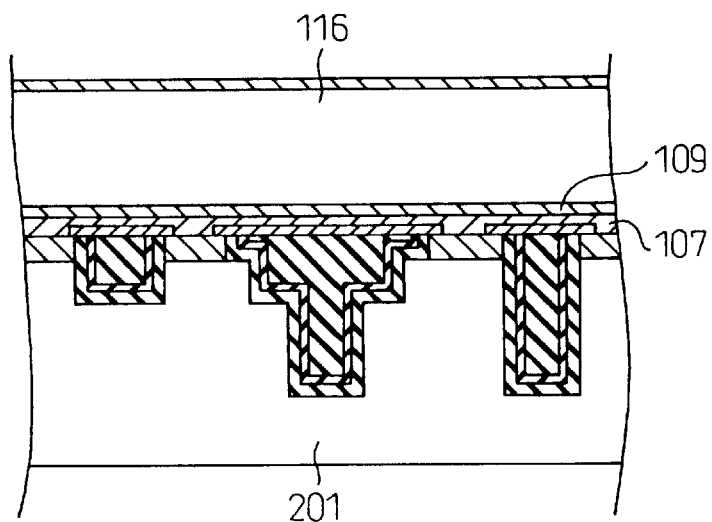
FIGS. 13(a) to 13(c) are cross-sectional views showing the fourth stage of a method of manufacturing a semiconductor device of the third embodiment of the present invention.

Next, as shown in FIG. 13(a), the element side silicon wafer 116 is stuck onto one face of the support side glass substrate 201. In the case of using the element side silicon wafer, on only one face of which the intermediate insulating film 109 is formed, the intermediate insulating film side of the element side silicon wafer is stuck onto one face side of the support side glass substrate 201.

In this case, sticking is conducted as follows. After the element side silicon wafer 116 has been placed on one face side of the support side glass substrate 201, the wafer is annealed.

In this case, attention should be given to the following. In the process shown in FIG. 12(b), the surface of the coating glass film 107 has been flattened. Due to the foregoing, when the above sticking motion is conducted, no gap is formed between the support side glass substrate 201 and the element side silicon wafer 108, so that they can be closely stuck to each other.

Figure 13B:
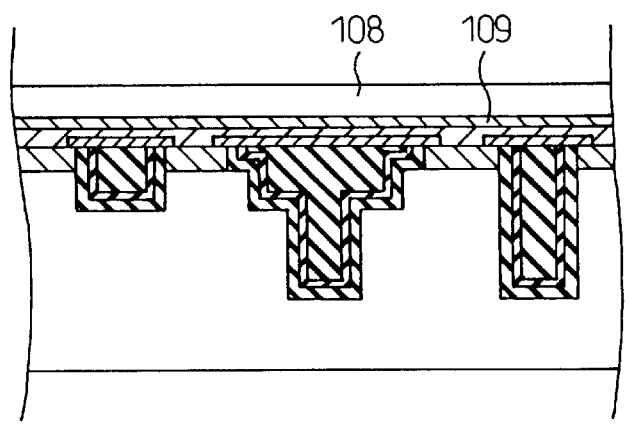

Next, as shown in FIG. 13(b), the element side silicon wafer 116 is polished by the CMP method, and the thickness is reduced. In this way, the semiconductor film 108, the thickness of which is about 0.5 to 50 µm, is provided.

In this case, an SOI structure is composed of this semiconductor film 108 and the intermediate insulating film 109 as explained in the first embodiment.

Figure 17A:
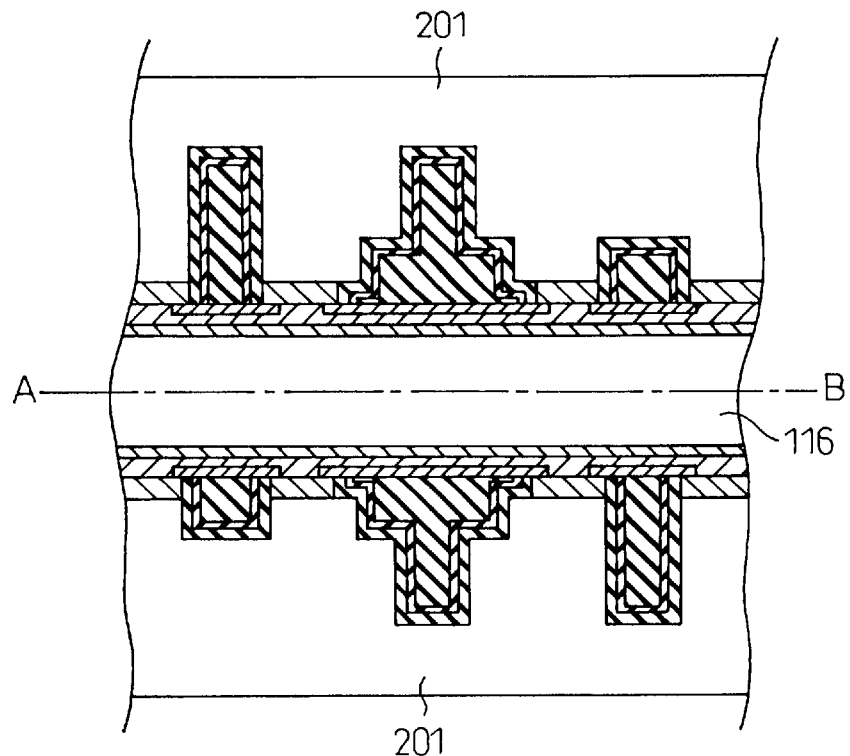
FIGS. 17(a) and 17(b) are cross-sectional views showing another example of a method of manufacturing a semiconductor device of the third embodiment of the present invention.
Figure 17B:
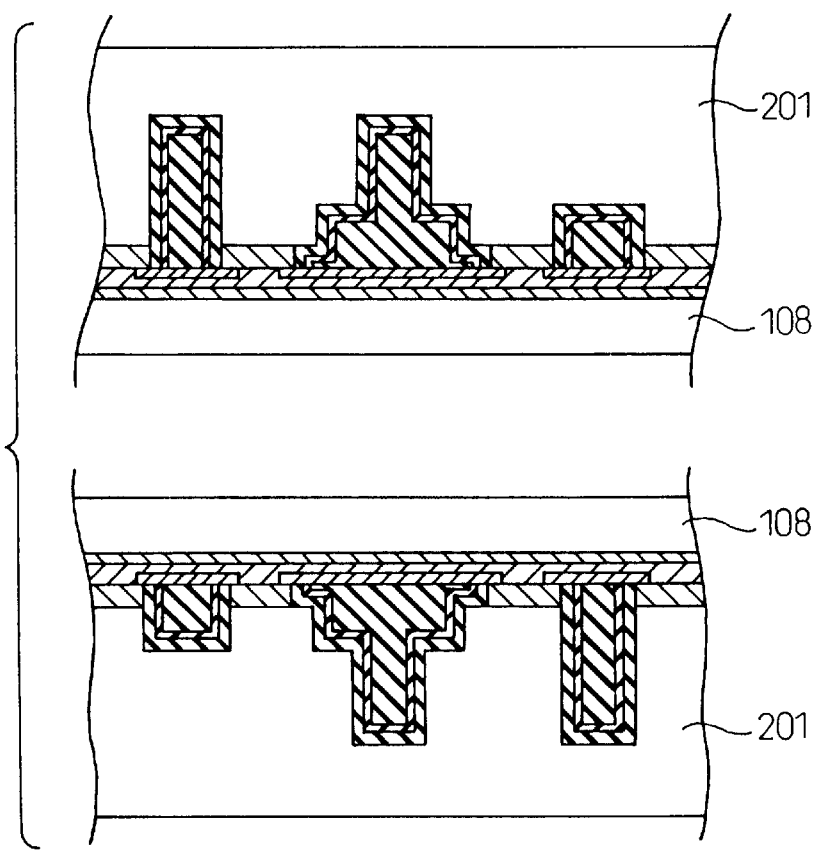

In this connection, instead of the processes shown in FIGS. 13(a) and 13(b), the processes shown in FIGS. 17(a) and 17(b) may be executed.

In the process shown in FIG. 17(a), one face of one of the two support side glass substrates 201 is stuck to one face of the element side silicon wafer 116, and one face of the other of the two support side glass substrates 201 is stuck to the other face of the element side silicon wafer 116. After that, the element side silicon wafer 116 is divided into two along the cross-section A-B in the drawing by a well-known wafer dividing technique.

FIG. 17(b) is a view showing a state in which the element side silicon wafer has been divided into two as described above. As can be seen, when the wafer dividing technique is applied, it is possible to make two structures in which the semiconductor film 108 is formed on one face of the support side glass substrate 201. Accordingly, when this method is adopted, the cost of manufacturing the element side silicon wafer 116 can be reduced to half.

Figure 13C:
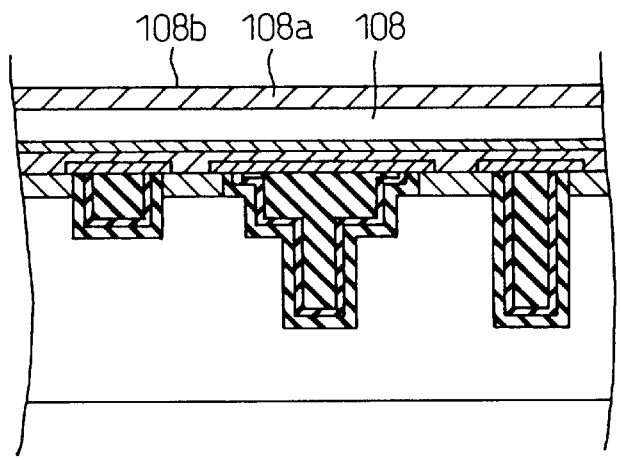

After the semiconductor film 108 has been formed in this way, the process shown in FIG. 13(c) is executed. In this process, the element forming layer 108a on which the elements such as a transistor are formed is formed.

In this connection, instead of the processes (shown in FIGS. 12(c) to 13(b)) of forming the semiconductor film 108 and also instead of the process (shown in FIG. 13(c)) of forming the elements on the semiconductor film 108, the following processes may be executed in the same manner as that of the first embodiment. A silicon wafer, on one face of which the semiconductor elements are formed, may be prepared, and a reverse face (on which the semiconductor elements are not formed) of the silicon wafer may be made to adhere onto the coating glass film 107, the surface of which is flattened, by adhesive.

Figure 14A:
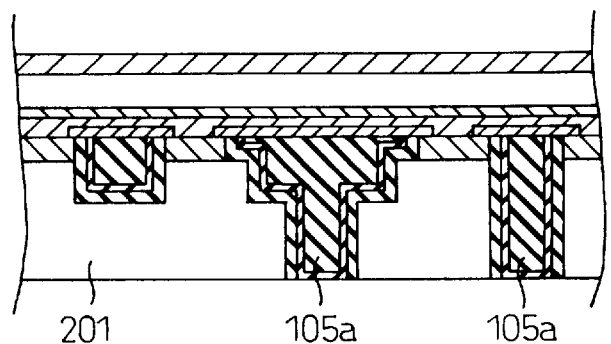
FIGS. 14(a) to 14(d) are cross-sectional views showing the fifth stage of a method of manufacture of the third embodiment of the present invention.

Successively, the other face of the support side glass substrate 201 is polished by the mechanical polishing method or the CMP method as shown in FIG. 14(a) so as to expose bottom faces of the primary connection plugs 105a.

Figure 14B:
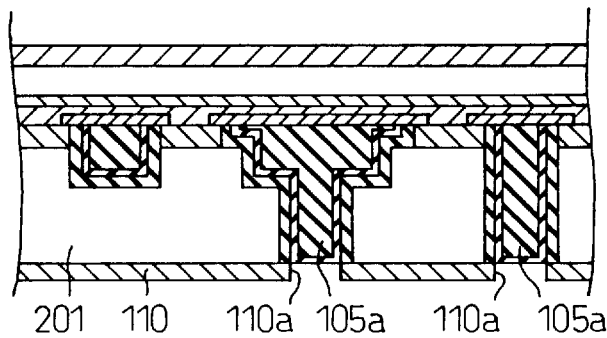

Next, as shown in FIG. 14(b), the surface insulating film 110 made of $SiO_2$ is formed on the other face of the support side glass substrate 201. This surface insulating film 110 is formed by the CVD method and the film thickness is approximately 10 to 1000 nm.

Figure 14C:
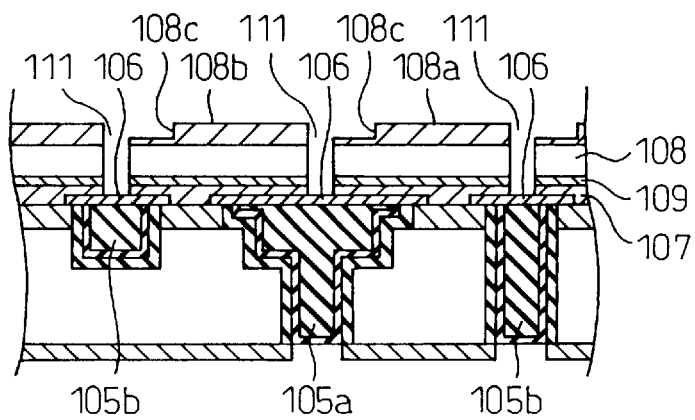

Next, as shown in FIG. 14(c), the second holes 111, 111, . . . , which are extended from the element forming face 108b to the barrier metal layer 106, are formed by means of etching. In the case where the barrier metal layer 106 is composed of dielectrics such as tantalum oxide, the barrier layer 106 is also subjected to etching, so that the second holes 111, 111, . . . can reach the primary connection plugs 105a and the primary wiring 105b. In this connection, in the case where the barrier metal layer 106 is not formed, the second holes 111 are formed so that they can reach the primary connection plugs 105a and the primary wiring 105b.

After the second holes 111 have been formed, the recess sections 108c communicating with the second holes 111 are formed on the element forming layer 108a by means of etching. In the same manner as that of the first embodiment, the recess sections 108c are formed so that the wiring layer of the element forming layer 108a can be exposed onto the side walls or the bottom faces of the recess sections 108c.

Figure 14D:
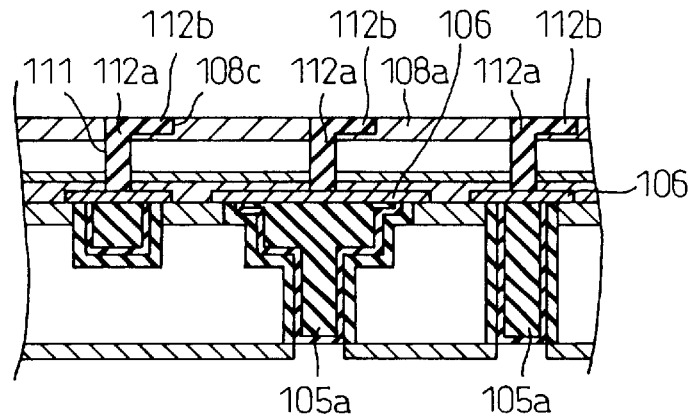

Next, as shown in FIG. 14(d), by the same method as that explained in the first embodiment, copper, which is an example of the second metal, is charged into the second holes 111 and the recess sections 108c. Due to the foregoing, the auxiliary connection plugs 112a composed of copper charged into the second holes 111 can be formed, and the upper electrode pads 112a composed of copper charged into the recess sections 108c can be also formed. In this connection, instead of copper, it is possible to use tungsten, aluminum, tantalum, titanium, nickel and chromium as the second metal.

Figure 15A:
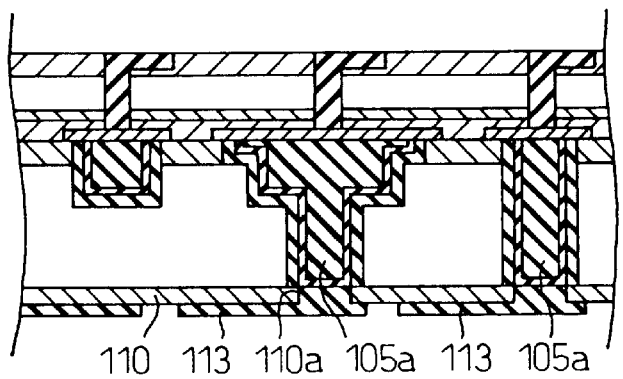
FIGS. 15(a) to 15(c) are cross-sectional views showing the sixth stage of a method of manufacture of the third embodiment of the present invention.

Next, as shown in FIG. 15(a), the lower electrode pads 113, 113, . . . made of copper are formed on the surface insulating film 110. These lower electrode pads 113, 113, . . . are formed by the subtractive method, the semi-additive method or the full-additive method. Accordingly, the lower electrode pads 113, 113, . . . are electrically connected with the primary connection plugs 105a via the opening sections 110a of the surface insulating film 110.

Figure 15B:
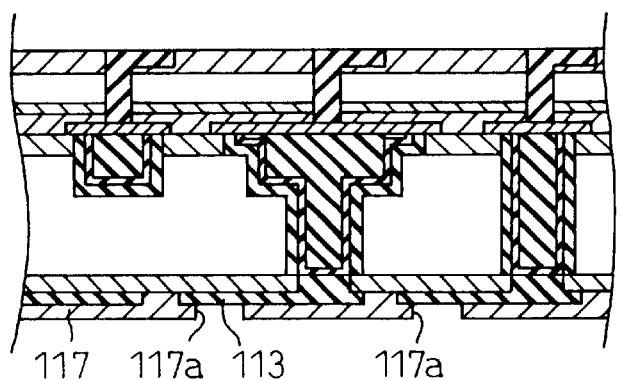

Successively, as shown in FIG. 15(b), the solder resist 117 is coated on the surface insulating layer 110 and the lower electrode 113. This solder resist 117 has opening sections 117a to which the surfaces of the lower electrode pads 113 are exposed.

Figure 15C:
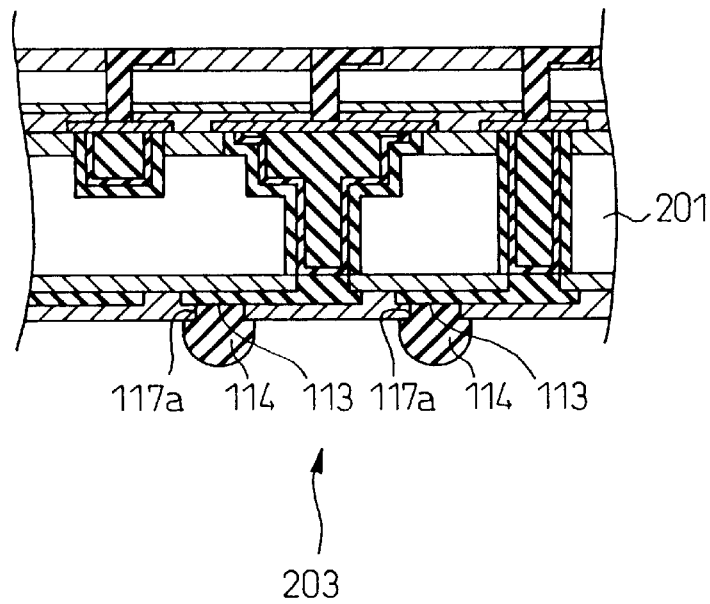

Next, as shown in FIG. 15(c), the solder bumps 114, 114, . . . are mounted on the lower electrode pads 113, 113, . . . via the opening sections 117a. Although not shown in the drawing, at the stage of completion of this process, a plurality of semiconductor devices 203, 203, . . . , which have been made by the method of manufacturing a semiconductor device of the present embodiment, are formed on one sheet of support side glass substrate 201.

After that, the semiconductor devices 203, 203, . . . are made to be individual pieces by means of dicing. After the semiconductor devices 203, 203, . . . have been made to be individual pieces, they are mounted on a mounting substrate (not shown) such as a mother board via the solder bumps 114, 114, . . . which are provided in each semiconductor device 203.

In this connection, the semiconductor device 203 manufactured by the method of the present embodiment may be used as a single body. Alternatively, as shown in FIG. 16, a plurality of semiconductor devices 203 may be laminated in the vertical direction as shown in FIG. 16 so that they can be formed into a three-dimensional mounting structure.

Figure 16:
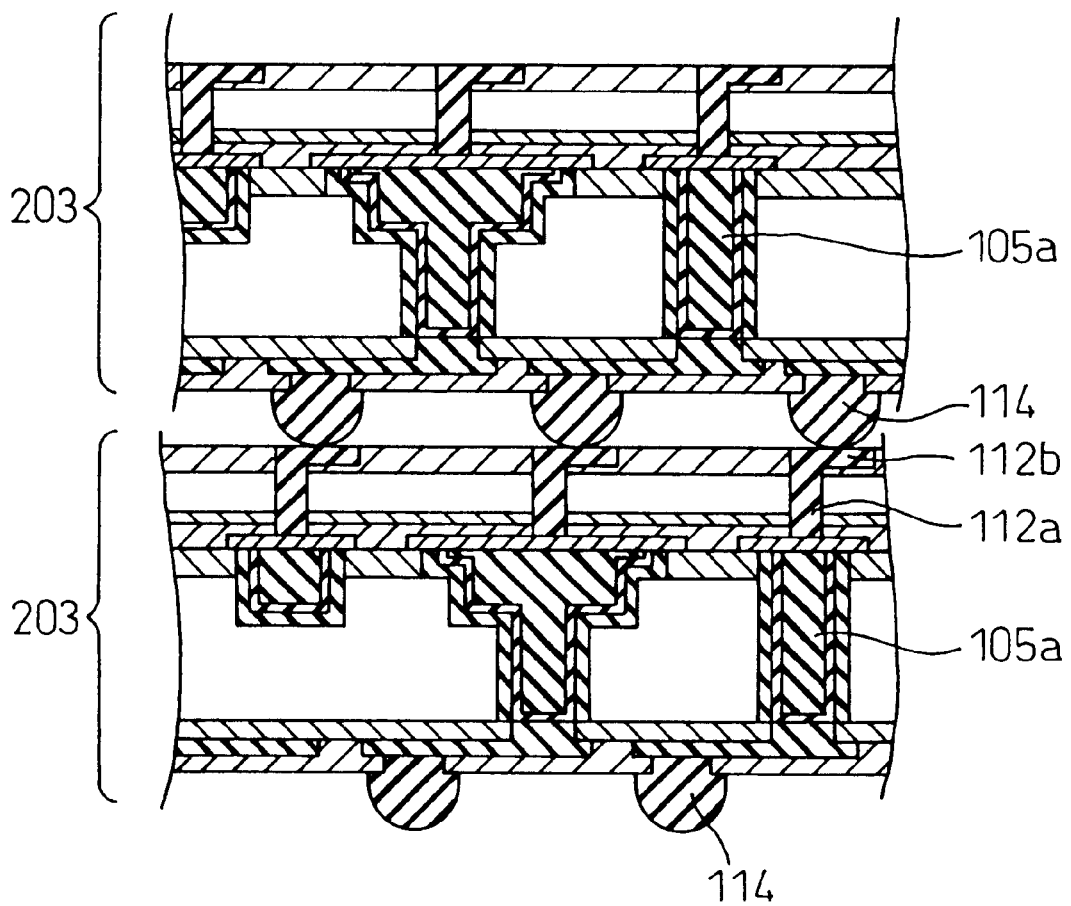
FIG. 16 is a cross-sectional view showing the seventh stage of a method of manufacture of the third embodiment of the present invention.

In the structure shown in FIG. 16, the solder bumps 114 provided in the upper side semiconductor device 203 are joined to the upper section electrode pads 112b provided in the lower side semiconductor device 203. Accordingly, in this structure, the primary connection plugs 105a of the upper side semiconductor device 203 are electrically connected with the auxiliary connection plugs 112a of the lower side semiconductor device 203.

When the semiconductor devices 203, 203 are laminated as described above so that they can be formed into a three-dimensional mounting structure, the mounting area can be reduced to be smaller than that in a case in which the semiconductor devices 203, 203 are arranged on the same one plane, which can greatly contribute to the downsizing of electronic equipment which has been recently demanded.

According to the method of manufacturing a semiconductor device of the present embodiment, in the same manner as that of the first embodiment, the process (shown in FIG. 13(c)) of forming elements is executed after the process (shown in FIG. 10(a)) of forming the first holes 201a used for the primary connection plugs 105a. Accordingly, when the first holes 201a are formed, no elements are damaged. Accordingly, in the present embodiment, the yield of manufacturing the semiconductor device can be enhanced as compared with a case in which the semiconductor device is manufactured by the conventional method.

(4) Fourth Embodiment

Next, referring to FIGS. 18 to 20, a method of manufacturing a semiconductor device of the fourth embodiment of the present invention will be explained below. In this connection, like reference characters are used to indicated like parts in the first to the third embodiment, and the explanations of like parts are omitted here.

The point of difference of this embodiment from the first to the third embodiment is a process in which the semiconductor film 108 is formed. Processes except for the above process are the same as those in the first to the third embodiment. Therefore, only the process in which the semiconductor film 108 is formed will be explained here.

Figure 18A:
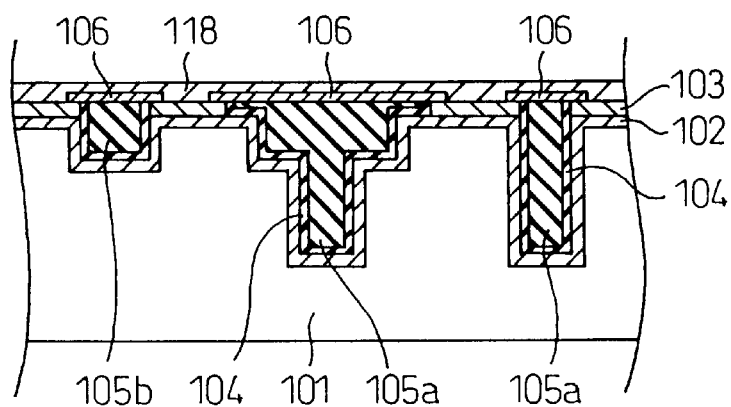
FIGS. 18(a) to 18(c) are cross-sectional views showing the first stage of a method of manufacturing a semiconductor device of the fourth embodiment of the present invention.

First, after the process shown in FIG. 2(d), as shown in FIG. 18(a), there is provided a process in which glass is coated on the wiring embedding insulating film 103 and the barrier metal layer 106, and the surface of the glass layer is polished and flattened so that $SiO_2$ film 118 (surface flattened film) is formed.

Figure 18B:
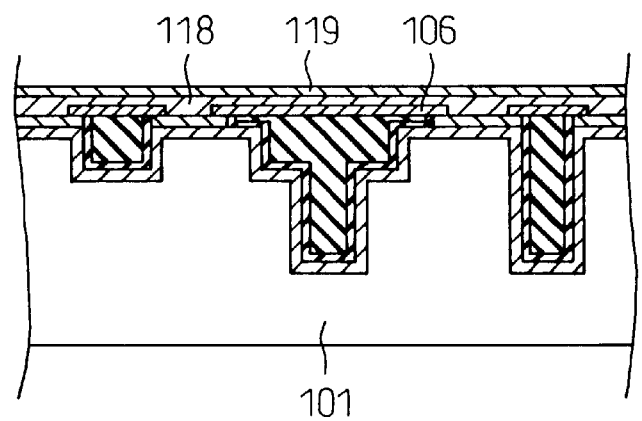

Next, as shown in FIG. 18(b), an $SiO_2$ film 119 is formed on $SiO_2$ film 118 by the CVD method. The thickness of this $SiO_2$ film 119 is approximately 5 to 500 nm.

Figure 18C:
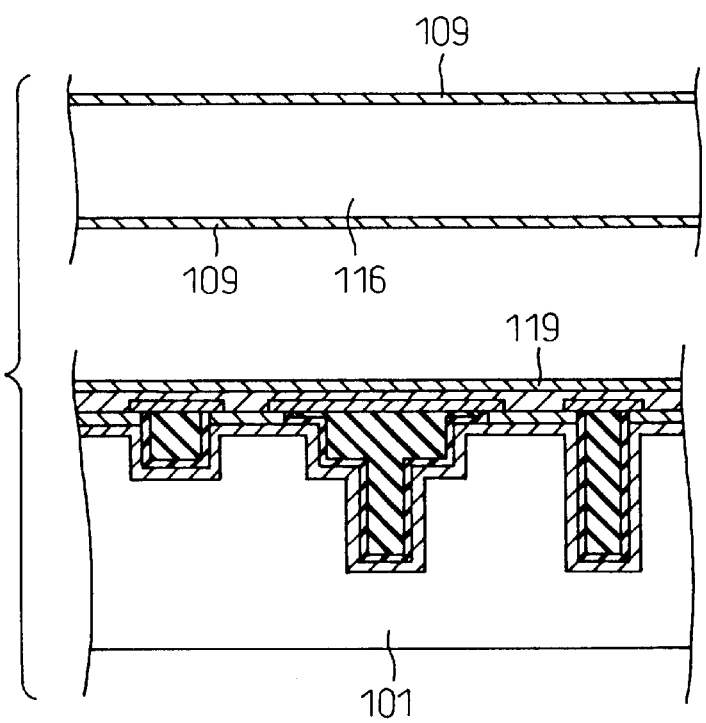

Next, as shown in FIG. 18(c), the element side silicon wafer 116 (element side semiconductor substrate), on the surface of which the intermediate insulating film 109 made of $SiO_2$ is formed, is prepared. The intermediate insulating film 109 is formed by thermally oxidizing the element side silicon wafer 116, and its thickness is 50 nm to 400 nm. In this connection, it is sufficient that the intermediate insulating film 109 is formed at least on one face of the element side silicon wafer 116, that is, the intermediate insulating film 109 is not necessarily formed on both sides of the element side silicon wafer 116 as in the structure shown in the drawing.

Figure 19A:
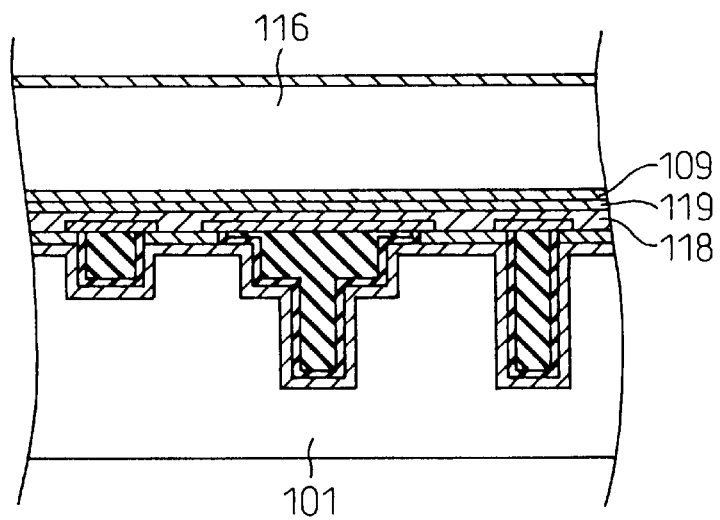
FIGS. 19(a) to 19(c) are cross-sectional views showing the second stage of a method of manufacture of the fourth embodiment of the present invention.
Figure 20:
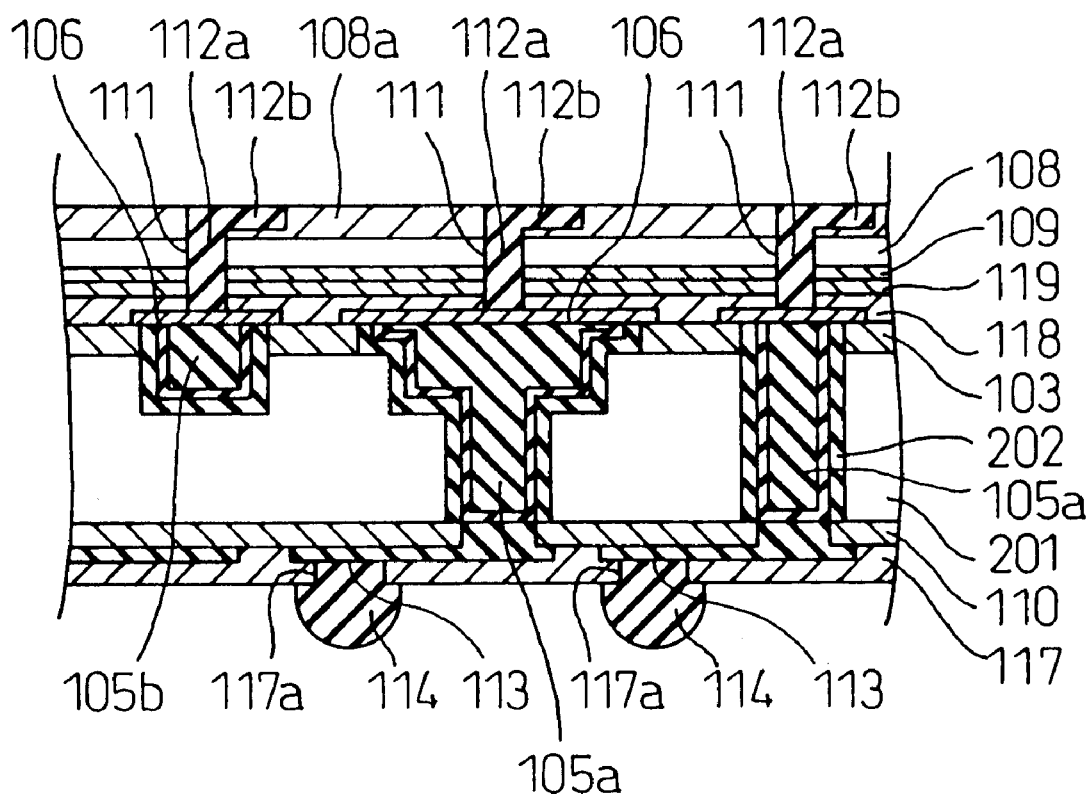
FIG. 20 is a cross-sectional view showing the third stage of a method of manufacturing a semiconductor device of the fourth embodiment of the present invention.

Next, as shown in FIG. 19(a), the element side silicon wafer 116 is stuck onto one face side of the support side silicon wafer 101. In the case of using the element side silicon wafer, on only one side of which the intermediate insulating film 109 is formed, the intermediate insulating film side of the element side silicon wafer is stuck to one face side of the support side silicon wafer 101.

In this case, the sticking is conducted in such a manner that, after the element side silicon wafer 116 has been placed on one face side of the support side silicon wafer 101, the entire is annealed.

Figure 19B:
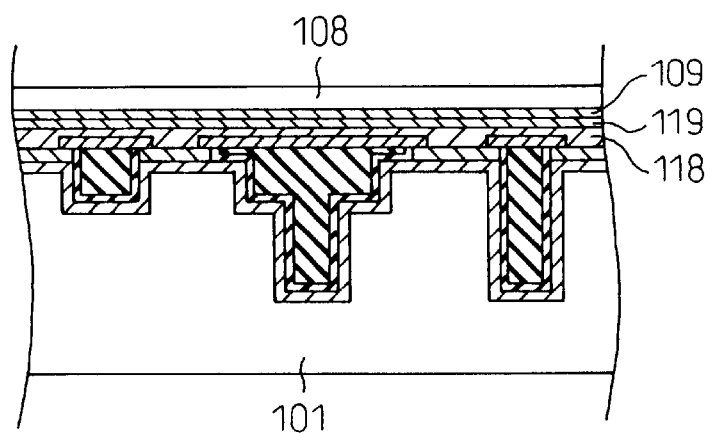

Next, as shown in FIG. 19(b), the element side silicon wafer 116 is peeled off. As the intermediate insulating film 109 is formed by thermally oxidizing the element side silicon wafer 116, the adherence strength between the intermediate insulating film 109 and the element side silicon wafer 116 is very high. Accordingly, even if the element side silicon wafer 116 is peeled off as described above, a thin Si (silicon) film is left on the surface of the intermediate insulating film 109. In other words, an Si (silicon) film close to the surface of the element side silicon wafer 116 is transferred onto the support side silicon wafer 101. In this embodiment, the thus transferred Si (silicon) film is used as the semiconductor film 108.

Figure 19C:
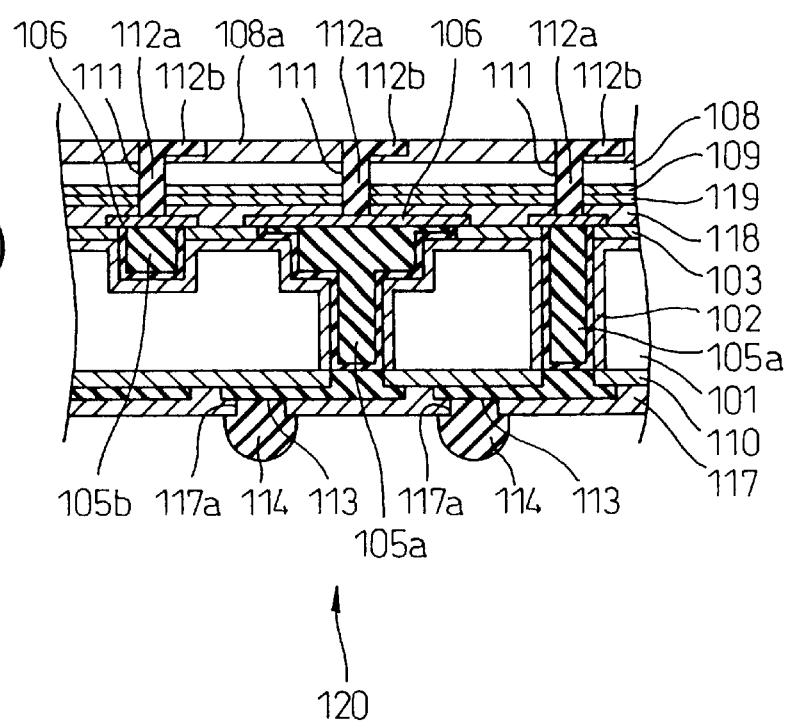

After that, the semiconductor device 120 shown in FIG. 19(c) is completed through the processes shown in FIGS. 4(c) to 6(c). In this connection, in the semiconductor device 120, the second holes 111, 111, . . . are formed so that the holes can penetrate the above CVD $SiO_2$ film 119.

The above process can be applied to not only a case in which the support side silicon wafer 101 is used but also to a case in which the support side glass substrate 201 is used. In this case, it is sufficient to execute the same process as that described above. Therefore, explanations are omitted here, and only a cross-sectional view of the completed semiconductor device 121 is shown in FIG. 20. As shown in FIG. 20, in this case, the second holes 111, 111, . . . are also formed so that the holes can penetrate the above $SiO_2$ film 119.

What is claimed is:

1. A semiconductor device comprising:

a support side semiconductor substrate having a first hole penetrating thereof;

a semiconductor film incorporated therein an element, said semiconductor film having a second hole penetrating thereof and being laminated on said support side semiconductor substrate;

a primary connecting plug comprising a first metal filled in said first hole; and an auxiliary connecting plug comprising a second metal filled in said second hole, said auxiliary connecting plug electrically connecting said primary connecting plug with said element.

2. A semiconductor device comprising:

a support side insulating substrate having a first hole penetrating thereof;

a semiconductor film incorporated with an element, said semiconductor film having a second hole penetrating thereof and being laminated on said support side insulating substrate;

a primary connecting plug comprising a first metal filled in said first hole; and an auxiliary connecting plug comprising a second metal filled in said second hole, said auxiliary connecting plug electrically connecting said primary connecting plug with said element.

* * * * *